(12) United States Patent
Jung et al.

(10) Patent No.: US 10,046,371 B2
(45) Date of Patent: Aug. 14, 2018

(54) RECYCLING UNIT, SUBSTRATE TREATING APPARATUS AND RECYCLING METHOD USING THE RECYCLING UNIT

(71) Applicant: Semes Co., Ltd., Cheonan-si, Chungcheongnam-do (KR)

(72) Inventors: Eun-Sun Jung, Cheonan-si (KR); Woo-Young Kim, Cheonan-si (KR); Chan-youn Heo, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 512 days.

(21) Appl. No.: 14/228,562

(22) Filed: Mar. 28, 2014

(65) Prior Publication Data

US 2014/0290092 A1 Oct. 2, 2014

(30) Foreign Application Priority Data

Mar. 29, 2013 (KR) .................. 10-2013-0034552
Jul. 18, 2013 (KR) .................. 10-2013-0084839

(51) Int. Cl.
*F26B 5/00* (2006.01)
*B08B 7/00* (2006.01)
(Continued)

(52) U.S. Cl.
CPC ............ *B08B 7/0021* (2013.01); *B01D 53/04* (2013.01); *B01D 53/0454* (2013.01);
(Continued)

(58) Field of Classification Search
CPC ..... B08B 7/0021; B08B 3/14; B01D 53/0454; Y02P 70/26754; F26B 25/06; F26B 21/083
(Continued)

(56) References Cited

U.S. PATENT DOCUMENTS 4,738,692 A * 4/1988 Fresch ................. B01D 53/047
95/122
5,833,738 A * 11/1998 Carrea .................. B01D 53/04
95/115
(Continued)

FOREIGN PATENT DOCUMENTS

CN 1400635 A 3/2003
CN 102205235 A 10/2011
(Continued)

*Primary Examiner* — John McCormack
(74) *Attorney, Agent, or Firm* — Harness, Dickey & Pierce, P.L.C.

(57) ABSTRACT

The substrate treating apparatus includes a process chamber in which an organic solvent remaining on a substrate is dissolved by using a fluid, that is provided as a supercritical fluid, to dry the substrate and a recycling unit including a recycler separating the organic solvent from the fluid discharged from the process chamber to recycle the fluid. The recycler includes a column having a space in which an absorbent for absorbing the organic solvent is stored, a supply tube supplying the fluid discharged from the process chamber into the space of the column, a discharge tube discharging the fluid from which the organic solvent is separated in the column, a gas supply tube supplying a purge gas into the column so that the organic solvent is separated from the absorbent, and an exhaust tube exhausting the purge gas containing the organic solvent to the outside of the column.

16 Claims, 19 Drawing Sheets

(51) Int. Cl.
*B01D 53/04* (2006.01)
*F26B 21/14* (2006.01)
*H01L 21/67* (2006.01)
*F26B 25/00* (2006.01)
*G03F 7/42* (2006.01)

(52) U.S. Cl.
CPC ............ *F26B 21/14* (2013.01); *F26B 25/006* (2013.01); *G03F 7/427* (2013.01); *H01L 21/6715* (2013.01); *H01L 21/67017* (2013.01); *H01L 21/67051* (2013.01); *B01D 2257/708* (2013.01); *B01D 2258/0216* (2013.01)

(58) Field of Classification Search
USPC .......... 34/570, 79, 80, 473; 95/1, 11; 96/116
See application file for complete search history.

(56) References Cited

U.S. PATENT DOCUMENTS

| | | | | |
|---|---|---|---|---|
| 8,080,095 | B2* | 12/2011 | Rood | B01D 53/0454 96/109 |
| 2002/0035921 | A1* | 3/2002 | Ishihara | B01D 53/22 95/45 |
| 2009/0165643 | A1* | 7/2009 | Huberland | B01D 53/0462 95/14 |
| 2010/0223805 | A1* | 9/2010 | Hyakutake | H01L 21/67028 34/427 |
| 2012/0048304 | A1* | 3/2012 | Kitajima | H01L 21/67034 134/30 |
| 2012/0152898 | A1* | 6/2012 | Cho | B08B 7/0021 216/59 |
| 2012/0317833 | A1* | 12/2012 | Hodoshima | C01B 3/38 34/517 |
| 2014/0157806 | A1* | 6/2014 | Ito | F24F 3/1411 62/92 |

FOREIGN PATENT DOCUMENTS

| | | |
|---|---|---|
| CN | 102856234 A | 1/2013 |
| JP | 2011025814 A * | 2/2011 |
| JP | 2012170857 A | 9/2012 |
| KR | 101994020755 | 8/1994 |
| KR | 1020130007397 | 1/2013 |

* cited by examiner

RECYCLING UNIT, SUBSTRATE TREATING APPARATUS AND RECYCLING METHOD USING THE RECYCLING UNIT

CROSS-REFERENCE TO RELATED APPLICATIONS

This U.S. non-provisional patent application claims priority under 35 U.S.C. § 119 of Korean Patent Application Nos. 10-2013-0034552, filed on Mar. 29, 2013, and 10-2013-0084839, filed on Jul. 18, 2013, the entire contents of which are hereby incorporated by reference.

BACKGROUND OF THE INVENTION

The present invention disclosed herein relates to a substrate manufacturing apparatus, and more particularly, to a unit for recycling a supercritical fluid that is used in a supercritical drying process, a substrate treating apparatus including the same, and a recycling method.

Semiconductor devices are manufactured through various processes such as a photolithography process for forming a circuit pattern on a substrate such as a silicon wafer. However, during the manufacturing process, various foreign substances such as particles, organic pollutants, metal impurities, and the like may be generated. Since the foreign substances cause substrate defects, this may have a direct effect on yield of the semiconductor devices. Thus, a cleaning process for removing the foreign substances may be essentially involved in the semiconductor manufacturing process.

In a general cleaning process, the foreign substances are removed from a substrate by using a cleansing agent, and then the substrate is cleaned by suing deionized water (DI-water). Thereafter, the substrate is dried by using isopropyl alcohol (IPA). However, since the drying process is reduced in drying efficiency when the semiconductor device has a fine circuit pattern, and a pattern collapse phenomenon in which the circuit pattern is damaged during the drying process frequently occurs, the driving process may be unsuitable for a semiconductor device having a line width of about 30 nm or less.

Thus, studies with respect to a technique for drying a substrate by using a supercritical fluid are being actively carried out so as to supplement the above-described drawbacks.

SUMMARY OF THE INVENTION

The present invention provides a substrate treating apparatus that is capable of extending a life cycle of an absorbent that is used when a supercritical fluid is recycled.

The object of the present invention is not limited to the aforesaid, but other objects not described herein will be clearly understood by those skilled in the art from descriptions below.

Embodiments of the present invention provide substrate treating apparatuses including: a process chamber in which an organic solvent remaining on a substrate is dissolved by using a fluid, that is provided as a supercritical fluid, to dry the substrate; and a recycling unit including a recycler separating the organic solvent from the fluid discharged from the process chamber to recycle the fluid, wherein the recycler includes: a column having a space in which an absorbent for absorbing the organic solvent is stored; a supply tube supplying the fluid discharged from the process chamber into the space of the column; a discharge tube discharging the fluid from which the organic solvent is separated in the column; a gas supply tube supplying a purge gas into the column so that the organic solvent is separated from the absorbent; and an exhaust tube exhausting the purge gas containing the organic solvent to the outside of the column.

In some embodiments, the substrate treating apparatuses may further include a heater heating the purge gas supplied into the column.

In other embodiments, the substrate treating apparatuses may further include: a valve disposed in the gas supply tube to adjust a supply amount of purge gas; and a controller controlling the valve so that the purge gas is non-uniformly supplied by lapse of time.

In still other embodiments, the controller may supply the purge gas by a first amount for one hour and by a second amount for two hours, wherein the first amount may be greater than the second amount, and the one hour and the two hours may be continuously repeated.

In even other embodiments, the second amount may be zero.

In yet other embodiments, the controller may control the valve so that the purge gas is supplied in a pulse-like manner.

In further embodiments, the substrate treating apparatuses may further include a concentration sensor disposed in the discharge tube to measure a concentration of the organic solvent contained in the fluid discharged from the discharge tube, wherein, when the measured concentration value reaches a preset valve, the controller may control the purge gas so that the purge gas is supplied into the column to recycle the absorbent.

In still further embodiments, the organic solvent may include isopropyl alcohol (IPA), and the fluid may include carbon dioxide ($CO_2$).

In even further embodiments, the absorbent may include zeolite.

In yet further embodiments, the recycling unit may further include a separator disposed between the process chamber and the recycler, wherein the separator may cool the fluid discharged from the process chamber to separate the organic solvent from the fluid, thereby supplying the fluid into the recycler.

In much further embodiments, the column may be provided in plurality, and the plurality of columns may be connected to each other in series.

In other embodiments of the present invention, recycling units include: a column having a space in which an absorbent for absorbing the organic solvent is stored; a supply tube supplying the fluid discharged from the process chamber into the space of the column; a discharge tube discharging the fluid from which the organic solvent is separated in the column; a gas supply tube supplying a purge gas into the column so that the organic solvent is separated from the absorbent; and an exhaust tube exhausting the purge gas containing the organic solvent to the outside of the column, wherein the organic solvent is separated from the fluid discharged from the process chamber to recycle the fluid.

In some embodiments, the recycling units may further include a heater heating the purge gas supplied into the column.

In other embodiments, the recycling unit may further include: a valve disposed in the gas supply tube to adjust a supply amount of purge gas; and a controller controlling the valve so that the purge gas is non-uniformly supplied by lapse of time.

In still other embodiments, the organic solvent may include isopropyl alcohol (IPA), and the fluid may include carbon dioxide ($CO_2$).

In even other embodiments, the absorbent may include zeolite.

In still other embodiments of the present invention, recycling methods for separating an organic solvent from a fluid, which is provided as a supercritical fluid containing the organic solvent, to recycle the fluid, include: allowing the fluid to pass through a column, in which an absorbent is provided, thereby absorbing the organic solvent to the absorbent; and when reaching a set condition, supplying a purge gas into the column to separate the organic solvent from the absorbent, thereby reusing the absorbent.

In some embodiments, the purge gas may include a nitrogen gas ($N_2$), and the nitrogen gas ($N_2$) may be provided in a heated state into the column.

In other embodiments, the recycling methods may further include supplying the purge gas in a pulse-like manner by elapse of time.

In still other embodiments, the set condition may include a case in which a measured concentration is above a preset value when a concentration within the fluid discharged from the column is measured.

In even other embodiments, the organic solvent may include isopropyl alcohol (IPA), and the fluid may include carbon dioxide ($CO_2$).

In yet other embodiments, the absorbent may include zeolite.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The invention may, however, be embodied in many different forms and should not be construed as being limited to the embodiments set forth herein; rather, these embodiments are provided so that this disclosure will be thorough and complete, and will fully convey the concept of the invention to those skilled in the art. Moreover, it will be understood that although the terms first and second are used herein to describe various elements, these elements should not be limited by these terms. In the following description of the present invention, a detailed description of known functions and configurations incorporated herein will be omitted to avoid making the subject matter of the present invention unclear.

A substrate treating apparatus 100 according to the present invention may be an apparatus for performing a cleaning process on a substrate S.

Here, the substrate S should be construed as sufficiently comprehensive to include all of various wafers such as silicon wafers, glass substrates, organic substrates, and substrates that are used for manufacturing semiconductor devices, displays, and objects in which a circuit is formed on a thin film.

Hereinafter, the substrate treating apparatus 100 will be described according to an embodiment.

Figure 1:
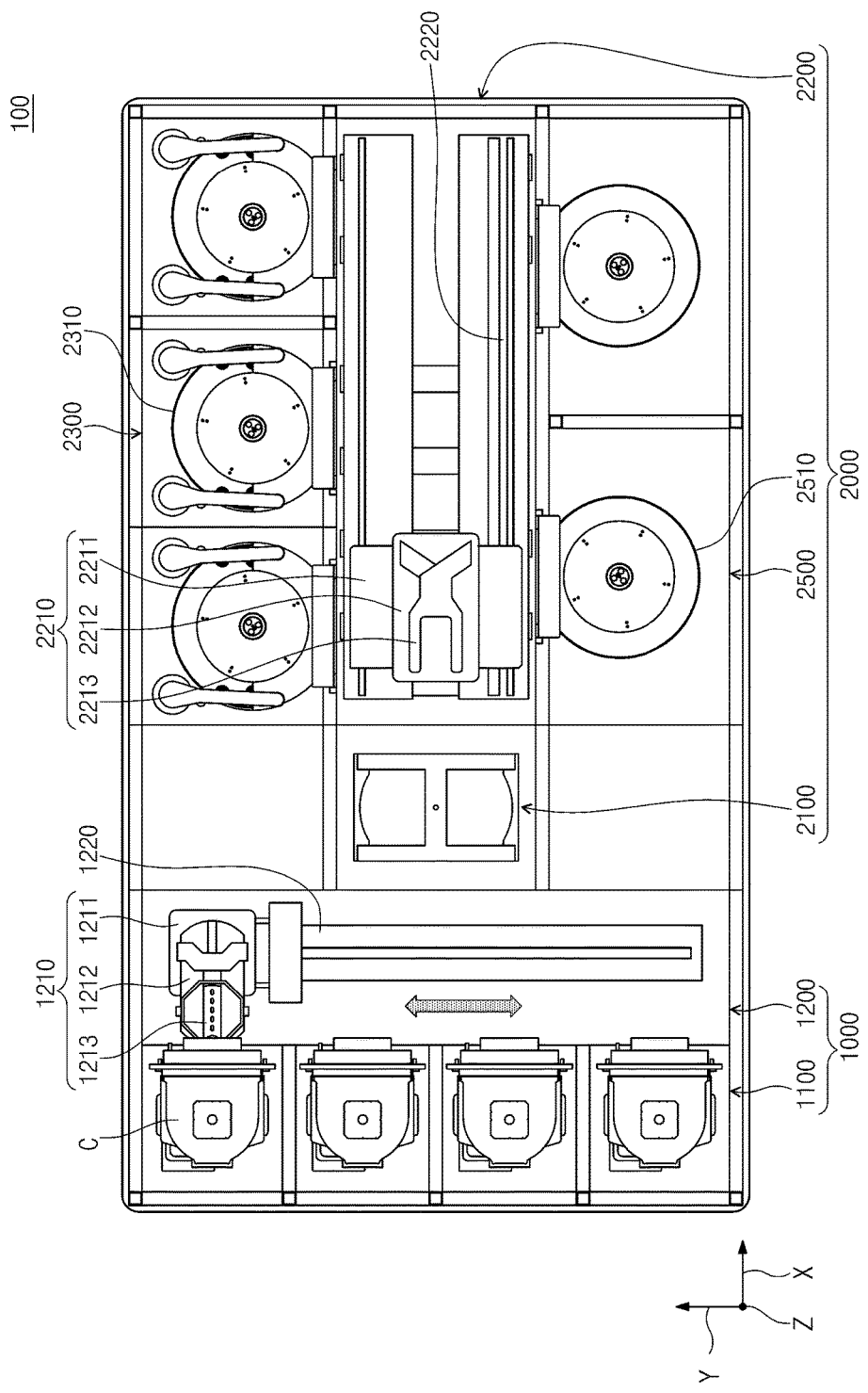
FIG. 1 is a plan view of a substrate treating apparatus according to an embodiment.

FIG. 1 is a plan view of a substrate treating apparatus 100 according to an embodiment.

The substrate treating apparatus 100 includes an index module 1000 and a process module 2000. The index module 1000 receives a substrate S from the outside to provide the substrate S into the process module 2000. The process module 2000 performs a cleaning process on the substrate S.

The index module 100 includes an equipment front end module (EFEM), a loadport 1100, and a transfer frame 1200. The loadport 1100, the transfer frame 1200, and the process module 200 may be successively arranged in a line. Here, a direction in which the loadport 1100, the transfer frame 1200, the process module 2000 are arranged may be referred to as a first direction X. Also, a direction perpendicular to the first direction X when viewed from an upper side may be referred to as a second direction Y, and a direction perpendicular to the first and second direction X and Y may be referred to as a third direction Z.

At least one loadport 1100 may be provided in the index module 1000. The loadport 1100 is disposed on a side of the transfer frame 1200. When the loadport 1100 is provided in plurality, the plurality of loadports 1100 may be arranged in a line along the second direction Y. The number and arrangement of the loadports are not limited to the above-described example. For example, the number and arrangement of the loadports may be adequately controlled in consideration of a foot print and process efficiency of the substrate treating apparatus 100 and a relatively placement of the substrate treating apparatus 100 with respect to the other substrate treating apparatus 100.

A carrier C in which the substrate S is accommodated is placed on the loadport 1100. The carrier C is transferred from the outside and then loaded on the loadport 1100, or is unloaded from the loadport 1100 and then transferred to the outside. For example, the carrier C may be transferred between the substrate treating apparatuses by a transfer device such as an overhead hoist transfer (OHT). Selectively, the transfer of the substrate S maybe performed by the other transfer device such as an automatic guided vehicle or a rail guided vehicle instead of the OHT or a worker. A front opening unified pod (FOUP) may be used as the carrier C.

At least one slot for supporting an edge of the substrate S may be defined in the carrier C. When the slot is provided in plurality, the slots may be spaced apart from each other along the third direction Z. For example, the carrier C may accommodate 25 sheets of substrates. The inside of the carrier C may be isolated and sealed from the outside by an openable door. Thus, it may prevent the substrate S accommodated in the carrier C from being contaminated.

The transfer frame 1200 transfers the substrate S between the carrier seated on the loadport 1100 and the process module 2000. The transfer frame 1200 includes an index robot 1210 and an index rail 1220.

The index rail 1220 guides a linear movement of the index robot 1210. The index rail 1220 may have a longitudinal direction that is parallel to the second direction Y.

The index robot 1210 transfers the substrate S. The index robot 1210 may include a base 1211, a body 1212, and an arm 1213.

The base 1211 is disposed on the index rail 1220. The base 1211 may move along the index rail 1220. The body 1212 is coupled to the base 1211 to move in the third direction Z or rotate by using the third direction Z as a rotation axis on the base 1211. The arm 1213 is disposed on the body 1212 to move forward and backward. A hand may be disposed on an end of the arm 1213 to pick up or out the substrate S. At least one arm 1213 may be provided on the index robot 1210. When the arm 1213 is provided in plurality, the plurality of arms 1213 may be stacked on the body 1212 in the third direction Z. Here, the stacked arms 1213 may be individually driven.

Thus, the base 1211 of the index robot 1210 may move along the index rail 1220 in the second direction Y. As the body 1212 and the arm 1213 operate, the substrate S may be taken out of the carrier C to load the substrate into the process chamber 2000, or the substrate S may be taken out of the process module 2000 and then accommodated into the carrier C.

On the other hand, the index rail 1220 may not be provided on the transfer frame 1200. Thus, the index robot 1210 may be fixed to the transfer frame 1200. Here, the index robot 1210 may be disposed at a center portion of the transfer frame 1200.

The process module 200 performs the cleaning process on the substrate S. The process module 2000 includes a buffer chamber 2100, a transfer chamber 2200, a first process chamber 2300, and a second process chamber 2500. The buffer chamber 2100 and the transfer chamber 2200 are disposed in the first direction X, and the transfer chamber 2200 has a longitudinal direction that is parallel to the first direction X. The process chambers 2300 and 2500 are disposed on a side surface of the transfer chamber 2200. The first process chamber 2300, the transfer chamber 2200, and the second process chamber 2500 may be successively arranged in the second direction Y.

The first process chamber 2300 may be disposed on one side of the transfer chamber 2200 in the second direction Y, and the second process chamber 2500 may be disposed on the other side that is opposite to the first process chamber 2300. The first process chamber 2300 may be provided in one or plurality. When the first process chamber 2300 is provided in plurality, the first process chambers 2300 may be arranged on one side of the transfer chamber 2200 in the first direction X, stacked in the third direction Z, or disposed by the combination thereof. Similarly, the second process chamber 2500 may be provided in one or plurality. When the driving chamber 2500 is provided in plurality, the second process chambers 2500 may be arranged on the other side of the transfer chamber 2200 in the first direction X, stacked in the third direction X, or disposed by the combination thereof.

However, the arrangement of the chambers in the process module 2000 is not limited to the above-described example. For example, the arrangement of the chambers may be adequately modified in consideration of the process efficiency. For example, as necessary, the first process chamber 2300 and the second process chamber 2500 may be disposed on the side surface, on which the transfer module is disposed, in the first direction X or stacked on each other.

The buffer chamber 2100 is disposed between the transfer frame 1200 and the transfer chamber 2200. The buffer chamber 2100 provides a buffer space in which the substrate S to be transferred between the index module 1000 and the process module 2000 temporarily stays. At least one buffer slot in which the substrate S is placed may be provided in the buffer chamber 2100. When the buffer slot is provided in plurality, the buffer slots may be spaced apart from each other in the third direction Z.

The substrate S that is taken out of the carrier C by the index robot 1210 may be seated on the buffer slot. Also, the substrate S that is taken out of the process chambers 2300 and 2500 by the transfer robot 2210 may be seated on the buffer slot. Also, the index robot 1210 or the transfer robot 2210 may take the substrate S out of the buffer slot to accommodate the substrate S into the carrier C or transfer the substrate S into the process chambers 2300 and 2500.

The transfer chamber 2200 transfers the substrate between the buffer chamber 2100, the first process chamber 2300, and the second process chamber 2500. The transfer chamber 2200 includes a transfer rail 2220 and a transfer robot 2210. The transfer rail 2220 provides a path along which the transfer robot 2210 moves. The transfer rail 2220 may be disposed parallel to the first direction X. The transfer robot 2210 transfers the substrate S. The transfer robot 2210 may include a base 2211, a body 2212, and an arm 2213. Since the components of the transfer robot 2210 are similar to those of the index robot 1210, their detailed descriptions will be omitted. The transfer robot 2210 may transfer the substrate S between the buffer chamber 2100, the first process chamber 2300, and the second process chamber 2500 by the operations of the body 2212 and the arm 2213 while the base 2211 moves along the transfer rail 2220.

The first process chamber 2300 and the second process chamber 2500 may perform different processes on the substrate S. Here, a first process performed in the first process chamber 2300 and a second process performed in the second process chamber 2500 may be successively performed. For example, a chemical process, a cleaning process, and a first drying process may be performed in the first process chamber 2300, and a second drying process that is a following process of the first process may be performed in the second process chamber 2500. Here, the first drying process may be a drying process that is performed by using an organic solvent, and the second drying process may be a supercritical process that is performed by using a supercritical fluid.

Figure 2:
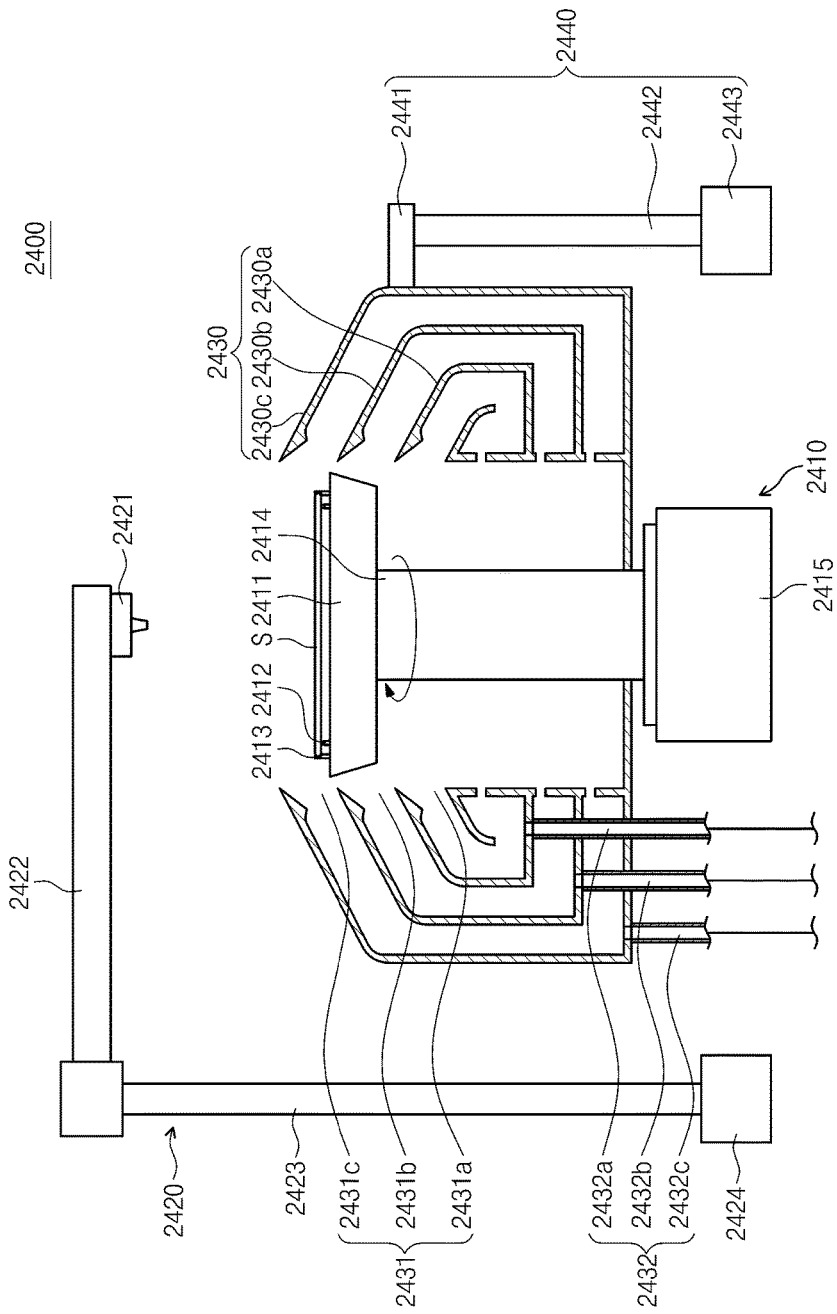
FIG. 2 is a cross-sectional view of a process chamber 1 of FIG. 1.

Hereinafter, the first process chamber 2300 will be described. FIG. 2 is a cross-sectional view of the first process chamber 2300 of FIG. 1.

The first process is performed in the first process chamber 2300. The first process chamber 2300 includes a housing 2310 and a process unit 2400. The housing 2310 defines an outer wall of the first process chamber 2300. The process unit 2400 is disposed inside the housing 2310 to perform the first process.

The process unit 2400 may include a spin head 2410, a fluid supply member 2420, a recovery box 2430, and an elevation member 2440.

The substrate S is seated on the spin head 2410. The spin head 2410 rotates the substrate S while the process is performed. The spin head 2410 may include a support plate 2411, a support pin 2412, a chucking pin 2413, a rotation shaft 2414, and a motor 2415.

The support plate 2411 may have an upper portion having a shape similar to that of the substrate S. For example, when the substrate includes a circular wafer, the support plate 2411 may have a circular shape. A plurality of support pins 2412 and a plurality of chucking pins 2413 are provided on the support plate 2411. The substrate S is placed on the plurality of support pins 2412. The plurality of chucking pins 2413 fix the substrate S. A rotation shaft 2414 is fixed and coupled to a bottom surface of the support plate 2411. The rotation shaft 2414 rotates by the motor 2415. The motor 2415 may generate a rotation force to rotate the support plate 2411 through the rotation shaft 2414. Thus, the substrate S may be seated on the spin head 2410 to rotate the substrate S while the first process is performed.

The plurality of support pins 2412 protrude from a top surface of the support plate 2411 in the third direction Z. When viewed from an upper side, the support pins 2412 may have an annular ring shape on the whole. A back surface of the substrate S is placed on the support pins 2412. Thus, the substrate S may be seated spaced a distance, by which the support pin 2412 protrudes, from the top surface of the support plate 2411 by the support pins 2412.

The chucking pin 2413 may further protrude from the top surface of the support plate 2411 than the support pin 2412 in the third direction Z. The chucking pin 2413 is disposed far away from a center of the support plate 2411 than the support pin 2412. The chucking pins 2413 may move between a support position and a standby position along a radius direction of the support plate 2411. The support position may be a position that is spaced a distance that corresponds to a radius of the substrate S from the center of the support plate 2411. The standby position may be a position that is far away from the center of the support plate 2411 when compared to the support position. The chucking pin 2413 may be disposed at the standby position when the substrate S is loaded onto or unloaded from the spin head 2410. Also, the chucking pin 2413 may move to the support position while the process is performed. Thus, the chucking pins 2413 may prevent the substrate S from being separated in position by a rotation force thereof when the spin head 2410 rotates.

The fluid supply member 2420 supplies a fluid onto the substrate S. The fluid supply member 2420 includes a nozzle 2421, a support 2422, a support shaft 2423, and a driver 2424. The support shaft 2423 may have a longitudinal direction along the third direction Z. The driver 2424 is coupled to a lower end of the support shaft 2423. The driver 2424 may rotate the support shaft 2423 or vertically move the support shaft 2423 in the third direction Z. The support 2422 is vertically coupled to an upper portion of the support shaft 2423. The nozzle 2421 is disposed on a bottom surface of an end of the support 2422. The nozzle 2421 may move between the support position and the standby position by the rotation and elevation of the support shaft 2423. The support position may be a position that is disposed directly above the support plate 2411. The standby position may be a position that get out of the directly upper side of the support plate 2411.

At least one fluid supply member 2420 may be provided in the process unit 2400. When the fluid supply member 2420 is provided in plurality, the fluid supply member 2420 may supply fluids different from each other. For example, each of the plurality of fluid supply members 2420 may supply a cleaning agent, a rinsing agent, or an organic solvent. The cleaning agent may include hydrogen peroxide ($H_2O_2$), ammonia ($NH_4OH$), hydrogen peroxide ($H_2SO_4$), hydrofluoric acid (HF), or a mixture thereof. The rinsing agent may include deionized water (DI-water), and the organic solvent may include isopropyl alcohol. Selectively, the organic solvent may include ethyl glycol, 1-propanol, tetra hydraulic franc, 4-hydroxyl, 4-methyl, 2-pentanone, 1-butanol, 2-butanol, methanol, ethanol, n-propyl alcohol, or dimethylether. For example, the first fluid supply member 2420a may spray an ammonia-hydrogen peroxide solution, the second fluid supply member 2420b may spray the ID-water, and the third fluid supply member 2420c may spray an isopropyl alcohol solution. However, the organic solvent may not be provided in a liquid state, but provided in a gaseous state. When the organic solvent is provided as vapor having the gaseous state, the organic solvent may be mixed with an inert gas.

The above-described fluid supply member 2420 may move from the standby position to the support position when the substrate S is seated on the spin head 2410 to supply the above-described fluid onto the substrate S. For example, as the fluid supply member supplies the cleaning agent, the rinsing agent, and the organic solvent, the chemical process, the cleaning process, and the first drying process may be performed. While the above-described processes are performed, the spin head 2410 may rotate to uniformly supply the fluids onto the substrate S.

The recovery box 2430 provides a space in which the first process is performed and recovers the fluid that is used in this process. When viewed from an upper side, the recovery box 2430 may be disposed around the spin head 2410 to surround the spin head 2410. Here, the recovery box 2430 may have an opened upper portion. At least one recovery box 2430 may be provided in the process unit 2400. Hereinafter, a case in which three recovery boxes 2430, i.e., a first recovery box 2430a, a second recovery box 2430b, and a third recovery box 2430c are provided will be described as an example. However, the number of recovery boxes 2430 may be differently selected according to the number of fluids and conditions of the first process.

Each of the first recovery box 2430a, the second recovery box 2430b, and the third recovery box 2430c may have an annular ring shape that surrounds the spin head 2410. The first recovery box 2430a, the second recovery box 2430b, and the third recovery box 2430c may be disposed successively away from a center of the spin head 2410. The first recovery box 2340a surrounds the spin head 2410, the second recovery box 2430b surrounds the first recovery box 2430a, and the third recovery box 2430c surrounds the second recovery box 2430b.

A first inflow hole 2431a is provided in the first recovery box 2430a by an inner space of the first recovery box 2430a. A second inflow hole 2431b is provided in the second recovery box 2430b by a space between the first recovery box 2430a and the second recovery box 2430b. A third inflow hole 2431c is provided in the third recovery box 2430c by a space between the second recovery box 2430b and the third recovery box 2430c. The first inflow hole 2431a, the second inflow hole 2431b, and the third inflow hole 2431c may be successively arranged downward from an upper side along the third direction Z. A recovery line 2432 extending downward along the third direction Z is connected to a bottom surface of each of the recovery boxes 2430a, 2430b, and 2430c. Each of the recovery lines 2432a, 2432b, and 2432c may discharge the fluids recovered by the recovery boxes 2430a, 2430b, and 2430c to supply the fluids into an external fluid recycling system (not shown). The fluid recycling system (not shown) may recycle the recovered fluids to reuse the fluids.

The elevation member 2440 includes a bracket 2411, an elevation shaft 2442, and an elevator 2443. The bracket 2441 is fixed to the recovery box 2430. The elevation shaft 2442 moving by the elevator 243 in the third direction Z is fixed and coupled to an end of the bracket 2441. When the recovery box 2430 is provided in plurality, the bracket 2441 may be coupled to the outermost recovery box 2430.

The elevation member 2440 moves the recovery box 2430 in the third direction Z. Thus, when the recovery box 2430 is provided in plurality, a relative height of the recovery box 2430 with respect to the spin head 2410 may be changed to selectively adjust a height of the inflow hole 2431 of any one recovery box 2430 so that the inflow hole 2431 is disposed on a horizontal plane of the substrate S that is seated on the spin head 2410.

Also, the elevation member 2440 may move the recovery box 2430 in the third direction Z while the first process is performed to adjust a height of the inflow hole 2431 of the recovery box 2430 so that the inflow hole 2431 corresponds to the substrate S. Thus, as the substrate S rotates, the fluid bounced off the substrate S may be recovered. For example, when the chemical process that is the first process, the cleaning process using the rinsing agent, and the first drying process using the organic solvent are successively performed, the elevation member 2440 may successively move the first inflow hole 2431a, the second inflow hole 2431b, and the third inflow hole 2431c. Thus, each of the first, second, and third recovery boxes 2430a, 2430b, and 2430c may recover the fluid.

The elevation member 2440 may move the spin head 2410 in the third direction Z instead of the movement of the recovery box 2430.

Hereinafter, the second process chamber 2500 will be described.

A second process is performed in the second process chamber 2500. Here, the second process may be a second drying process for drying the substrate S by using a supercritical fluid.

Hereinafter, carbon dioxide ($CO_2$) that is used as the supercritical fluid will be described as an example. However, the present invention is not limited to a kind of supercritical fluid.

Figure 3:
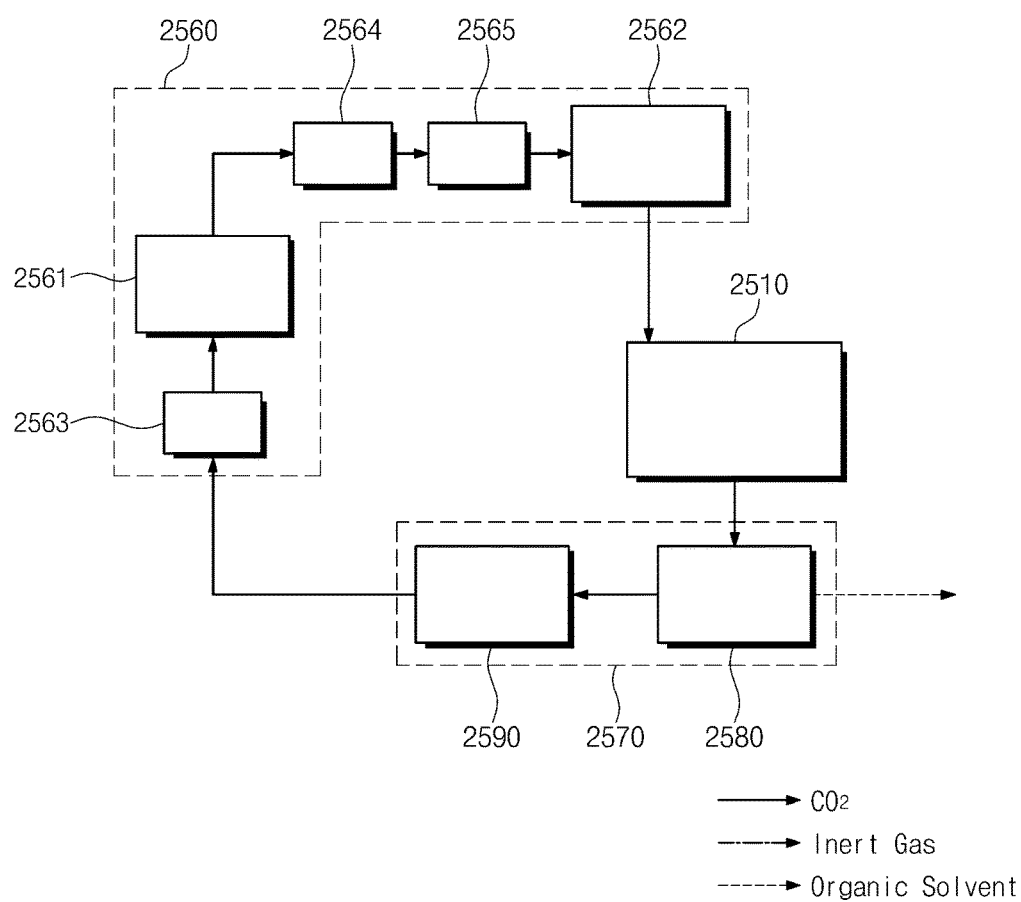
FIG. 3 is a view of a circulation system of a supercritical fluid.

FIG. 3 is a view of a supply system of the supercritical fluid. The supercritical fluid supply system includes a housing 2510, a supply unit 2560, and a recycling unit 2570.

Figure 4:
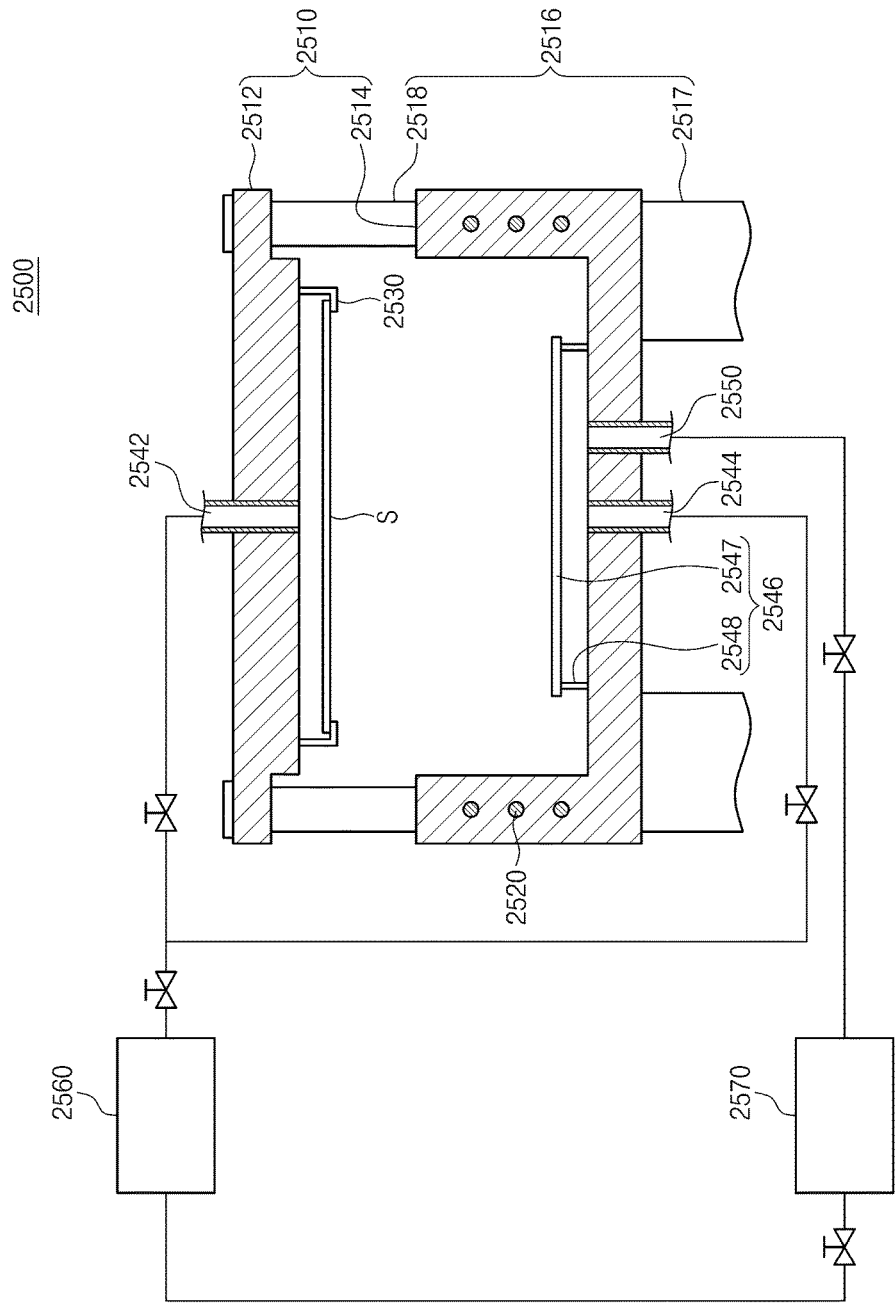
FIG. 4 is a cross-sectional view of a second process chamber of FIG. 1 according to an embodiment.

FIG. 4 is a cross-sectional view of the second process chamber 2500 of FIG. 1 according to an embodiment. Referring to FIG. 4, the second process chamber 2500 may include a housing 2510, an elevation member 2516, a support member 2530, a heating member 2520, a supply port 2540, a blocking member 2546, and an exhaust port 2550.

The housing 2510 may provide a space in which a supercritical drying process is performed. The housing 2510 may be formed of a material that is capable of enduring a high pressure greater than a critical pressure.

The housing 2510 may include an upper housing 2512 and a lower housing 2514 disposed under the upper housing 2512. That is, the housing 2510 may have a structure which is divided into upper and lower portions.

The upper housing 2512 is fixed, and the lower housing 2514 may be elevated. When the lower housing 2514 descends and then is spaced from the upper housing 2512, an inner space of the second process chamber 2500 may be opened. Thus, the substrate S may be loaded into or unloaded from the inner space of the second process chamber 2500. Here, the substrate S loaded into the second process chamber 2500 may be in a state in which the organic solvent remains after an organic solvent process is performed in the first process chamber 3000. Also, when the lower housing 2514 ascends and then is closely attached to the upper housing 2512, the inner space of the second process chamber 2500 may be sealed, and the supercritical drying process may be performed in the inner space. Unlike the above-described example, the lower housing 2514 may be fixed to the housing 2510, and the upper housing 2512 may be elevated.

The elevation member 2516 elevates the lower housing 2514. The elevation member 2516 may include an elevation cylinder 2517 and an elevation rod 2518. The elevation cylinder 2517 is coupled to the lower housing 2514 to generate a vertical driving force, i.e., an elevating force. The elevation cylinder 2517 may endure the high pressure that is above the critical pressure within the second process chamber 2500 while the supercritical drying process is performed. Also, the elevation cylinder 2517 may generate a driving force that is enough to closely attach the upper and lower housings 2512 and 2514 to each other to seal the inside of the second process chamber 2500. The elevation rod 2518 has one end inserted into the elevation cylinder 2517 and the other end extending upward and coupled to the upper housing 2512. Due to the above-described structure, when the driving force is generated in the elevation cylinder 2517, the elevation cylinder 2517 and the elevation rod 2518 may relatively ascend to allow the lower housing 2514 coupled to the elevation cylinder 2517 to ascend. Also, while the lower housing 2514 ascends by the elevation cylinder 2517, the elevation rod 2518 may prevent the upper and lower housings 2512 and 2514 from horizontally moving and may guide an elevation direction to prevent the upper and lower housings 2512 and 2514 from being separated from fixed positions thereof.

The support member 2530 supports the substrate S between the upper housing 2512 and the lower housing 2514. The support member 2530 may be disposed on a bottom surface of the upper housing 2512 to extend directly downward. Also, the support member 2530 may be perpendicularly bent from a lower end of the upper housing 2512 in a horizontal direction. Thus, the support member 2530 may support an edge area of the substrate S. As described above, since the support member 2530 contacts the edge region of the substrate S to support the substrate S, the supercritical drying process may be performed on an entire area of a top surface of the substrate S and most areas of a bottom surface of the substrate S. Here, the top surface of the substrate S may be a pattern surface, and the bottom surface of the substrate S may be a non-pattern surface. Also, since the fixed upper housing 2512 is provided, the support member 2530 may relatively stably support the substrate S while the lower housing 2514 is elevated.

A horizontal adjustment member 2532 may be disposed in the upper housing 2512 in which the support member 2530 is provided. The horizontal adjustment member 2532 may adjust horizontality of the upper housing 2512. When the upper housing 2512 is adjusted in horizontality, the substrate S seated on the support member 2530 disposed in the upper housing 2512 may be adjusted in horizontality. When the substrate S is tilted in the supercritical drying process, the organic solvent remaining on the substrate S may flow along a sloop to cause a phenomenon in which a specific portion of the substrate S is not dried or overdried, thereby damaging the substrate S. The horizontal adjustment member 2532 may adjust horizontality of the substrate S to prevent the above-described phenomenon from occurring. Of cause, when the upper housing 2512 ascends, and the lower housing 2514 is fixed, or when the support member 2530 is disposed in the lower housing 2514, the horizontal adjustment member 2532 may be provided in the lower housing 2514.

The heating member 2520 may heat the inside of the second process chamber 2500. The heating member 2520 may heat the supercritical fluid supplied into the second process chamber 2500 at a temperature greater than a critical temperature to maintain the supercritical fluid to a supercritical fluid state or change the supercritical fluid again into the supercritical fluid state if the supercritical fluid is liquefied. The heating member 2520 may be buried in at least one wall of the upper and lower housings 2512 and 2514. For example, the heating member 2520 may be provided as a heater for receiving a power from the outside to generate heat.

The supply port 2540 supplies the supercritical fluid to the second process chamber 2500. The supply port 2540 may be connected to the supply unit 2560. Here, a valve for adjusting a flow rate of the supercritical fluid supplied from the supply unit 2560 may be disposed in the supply port 2540.

The supply port 2540 may include an upper supply port 2542 and a lower supply port 2544. The upper supply port 2542 may be provided in the upper housing 2512 to supply the supercritical fluid onto the top surface of the substrate S supported by the support member 2530. The lower supply port 2544 may be provided in the lower housing 2514 to supply the supercritical fluid onto the bottom surface of the substrate S that is supported by the support member 2530.

The supply ports 2540 may spray the supercritical fluid onto a central area of the substrate S. For example, the upper supply port 2542 may be disposed directly above a center of the substrate S supported by the support member 2530. Also, the lower supply port 2544 maybe disposed directly below the center of the substrate S supported by the support member 2530. Thus, the supercritical fluid sprayed from the supply ports 2540 may be uniformly supplied onto an entire area of the substrate S while the supercritical fluid reaches a central area of the substrate S and spread to an edge area of the substrate S.

In the upper and lower supply ports 2542 and 2544, the lower supply port 2544 may supply the supercritical fluid, and then, the upper supply port 2542 may supply the supercritical fluid. Since the supercritical drying process is performed in a state where an internal pressure of the second process chamber 2500 is less than the critical pressure, the supercritical fluid supplied into the second process chamber 2500 may be liquefied. Thus, when the supercritical fluid is supplied into the upper supply port 2542 during an initial supercritical drying process, the supercritical fluid may be liquefied to drop onto the substrate S by gravity, thereby damaging the substrate S. The upper supply port 2542 may start the supply of the supercritical fluid, when the supercritical fluid is supplied into the second process chamber 2500 through the lower supply port 2544 to allow the internal pressure of the second process chamber 2500 to reach the supercritical pressure, to liquefy the supercritical fluid, thereby preventing the supercritical fluid from dropping onto the substrate S.

The blocking member may prevent the supercritical fluid supplied through the supply ports 2540 from being directly sprayed onto the substrate S. The blocking member may include a blocking plate 2547 and a support 2548.

The blocking plate 2547 is disposed between the supply port 2540 and the substrate S supported by the support member 2530. For example, the blocking plate 2547 may be disposed between the lower supply port 2544 and the support member 2530 and disposed under the substrate S. The blocking plate 2547 may prevent the supercritical fluid supplied through the lower supply port 2544 from being directly sprayed onto the bottom surface of the substrate S.

The blocking plate 2547 may have a radius similar to or greater than that of the substrate S. In this case, the blocking plate 2547 may completely block the direct spraying of the supercritical fluid onto the substrate S. Also, the blocking plate 2547 has a radius less than that of the substrate S. In this case, the direct spraying of the supercritical fluid onto the substrate S may be blocked, and also a flow rate of the supercritical fluid may be reduced to allow the supercritical fluid to relatively easily reach the substrate S, thereby effectively performing the supercritical drying process on the substrate S.

The support 2548 supports the blocking plate 2547. That is, the blocking plate 2547 may be disposed on an end of the support 2548. The support 2548 may extend directly upward from the bottom surface of the housing 2510. The support 2548 and the blocking plate 2547 may be designed so that the blocking plate 2547 is simply placed on the support 2548 by the gravity without using a separate coupling unit. When the support 2548 and the blocking plate 2547 are coupled to each other by using a coupling unit such as a nut or bolt, the supercritical fluid having high penetrability may be penetrated between the support 2548 and the blocking plate 2547 to generate contaminants. Alternatively, the support 2548 and the blocking plate 2547 may be integrated with each other.

When the supercritical fluid is supplied through the lower supply port 2544 during the initial supercritical drying process, since an internal pressure of the housing 2519 is low, the supplied supercritical fluid may be sprayed at a high speed. When the supercritical fluid sprayed at the high speed directly reaches the substrate S, a leaning phenomenon in which a portion of the substrate S to which the supercritical fluid is directly sprayed is bent by a physical pressure of the supercritical fluid may occur. Also, the substrate may be shaken by the spraying force of the supercritical fluid. Here, the organic solve remaining on the substrate S may flow to damage a circuit pattern of the substrate S.

Thus, the blocking plate 2547 disposed between the lower supply port 2544 and the support member 2530 may block the direct spraying of the supercritical fluid onto the substrate S to prevent the substrate S from being damaged by a physical force of the supercritical fluid. After the process is performed, the supercritical fluid may be exhausted into the recycling unit 2570 through the exhaust port 2550.

The second drying process is performed in the second process chamber 2500 by using the supercritical fluid. For example, the second drying process may be performed on the substrate S, on which the chemical process, the cleaning process, and the first drying process using the organic solvent are successively performed in the first process chamber 2300, by using the supercritical fluid in the second process chamber 2500. When the substrate S is seated on the support member 2530 by the transfer robot 2210, the heating member 2520 heats the inside of the housing 2510 to supply the supercritical fluid through the supercritical fluid supply tube 2540. As a result, a supercritical atmosphere may be formed in the housing 2510. When the supercritical atmosphere is formed, the organic solvent remaining on a top surface of the pattern of the substrate S may be dissolved by the supercritical fluid. When the organic solvent is sufficiently dissolved, the supercritical fluid may be discharged through a discharge hole. Thereafter, the supercritical fluid is supplied again into the supply unit 2560. That is, the supply unit 2560 supplies the supercritical fluid into the second process chamber 2500, and the recycling unit 2570 recycles the supercritical fluid that is used in the second process chamber to supply the recycled supercritical fluid into the supply unit 2560.

Referring again to FIG. 3, the supply unit 2560 may include a storage tank 2561, a water supply tank 2562, a first condenser 2563, a second condenser 2564, and a pump 2565.

Liquid carbon dioxide is stored in the storage tank 2561. The carbon dioxide is supplied from the outside or the recycling unit 2570 and then stored in the storage tank 2561. Here, the carbon dioxide supplied from the outside or the recycling unit 2570 may be in a gaseous state. The first condenser 2563 may change the gaseous state into a liquid state to supply the liquefied carbon dioxide into the storage tank 2561.

The water supply tank 2562 receives the carbon dioxide from the storage tank 2561 to generate the supercritical fluid. The supercritical fluid is supplied into the second process chamber 2500. The carbon dioxide may be changed in the gaseous state in the storage tank 2561 to move into the water supply tank 2562. Here, the second condenser 2564 and the pump 2565 may be disposed between the storage tank 2561 and the water supply tank 2562. The second condenser 2564 changes the gaseous carbon dioxide into liquid carbon dioxide. The pump 2565 may change the liquid carbon dioxide into a gas that is pressed at a pressure greater than the critical pressure to supply the gaseous carbon dioxide into the water supply tank 2562. The water supply tank 2562 heats the supplied carbon dioxide to a temperature greater than the critical temperature to generate the supercritical fluid, thereby supplying the supercritical fluid into the second process chamber 2500. Here, the carbon dioxide discharged from the water supply tank 2562 may have a pressed pressure of about 100 bar to about 150 bar.

Figure 5:
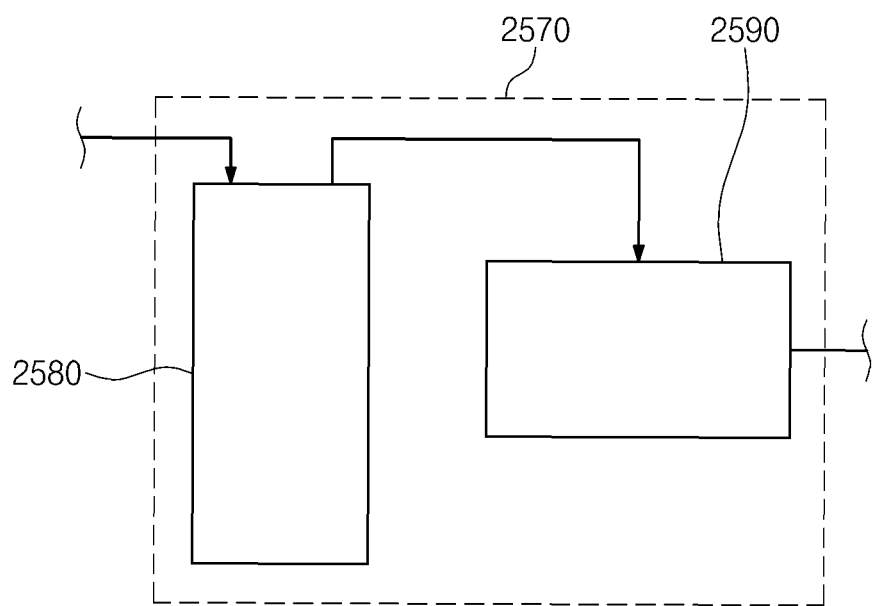
FIG. 5 is a view of a recycling unit of FIG. 3.

FIG. 5 is a cross-sectional view of the recycling unit 2570 of FIG. 4 according to an embodiment.

The recycling unit 2570 includes a separator 2580 and a recycler 2590. The recycling unit 2570 may recycle the supercritical fluid, which is used for the second drying process in the second process chamber 2500 to contain the organic solvent, to supply the supercritical fluid into the supply unit 2560. The separator 2580 may cool the carbon dioxide to liquefy the organic solvent contained in the carbon dioxide, thereby primarily separating the organic solvent from the carbon dioxide. The recycler 2590 may allow the carbon dioxide to pass through a space in which an absorbent A for absorbing the organic solvent is provided, thereby secondarily separating the organic solvent from the carbon dioxide.

Figure 6:
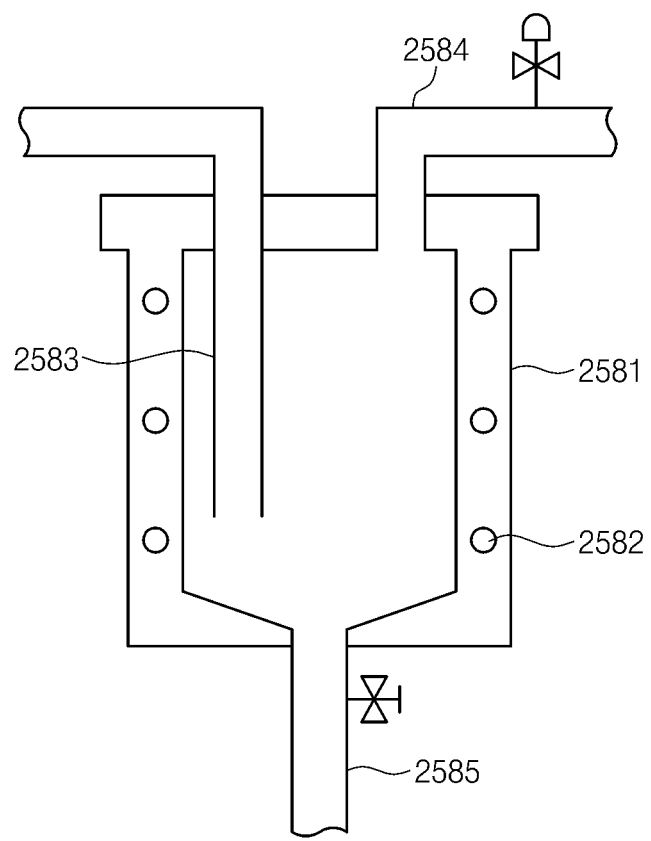
FIG. 6 is a view of a separator of FIG. 5 according to an embodiment.

FIG. 6 is a cross-sectional of the separator 2580 of FIG. 5. The separator 2580 includes a separation tank 2581, a cooling member 2582, an inflow tube 2583, an exhaust tube 2584, a drain tube 2585, and a pressure adjustment unit 2586.

The separation tank 2581 provides a space in which the carbon dioxide and the organic solvent are separated from each other. The cooling member 2582 may be disposed between an inner wall and an outer wall of the separation tank 2581 to cool the separation tank 2581. The cooling member 2582 may be realized as a pipe line through which coolant flows. The carbon dioxide discharged from the second process chamber 2500 is introduced through the inflow tube 2583. The inflow tube 2583 may supply the carbon dioxide into a lower portion of the separation tank 2581 through an end thereof. The carbon dioxide provided into the lower portion of the separation tank 2581 is cooled by the cooling member 2582. Thus, the organic solvent contained in the carbon dioxide is liquefied and then separated fro the carbon dioxide.

The separated carbon dioxide is discharged through the exhaust tube 2584 connected to an upper portion of the separation tank 2581. The liquid organic solvent is discharged through the drain tube 2585 connected to a lower portion of the separation tank 2581. A valve V maybe disposed in each of the inflow tube 2583, the exhaust tube 2584, and the drain tube 2585 to adjust introduction and discharge of the organic solvent.

Figure 7:
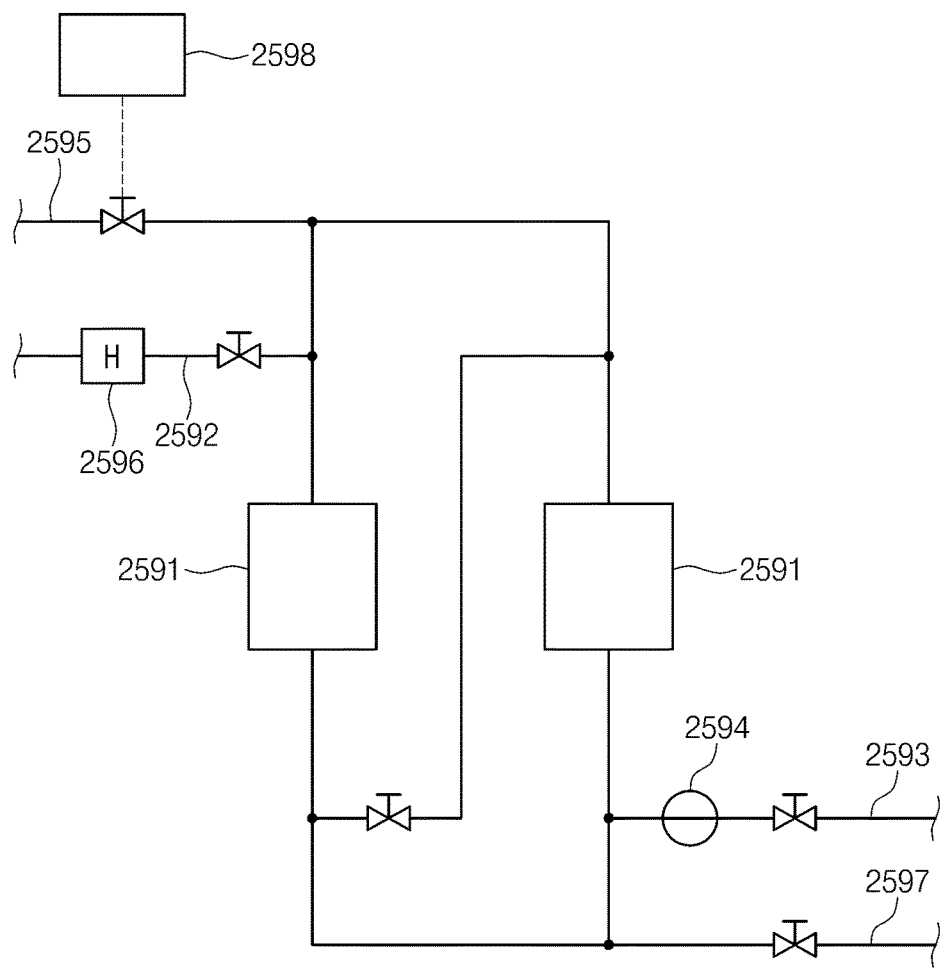
FIG. 7 is a view of a recycler of FIG. 5 according to an embodiment.
Figure 8:
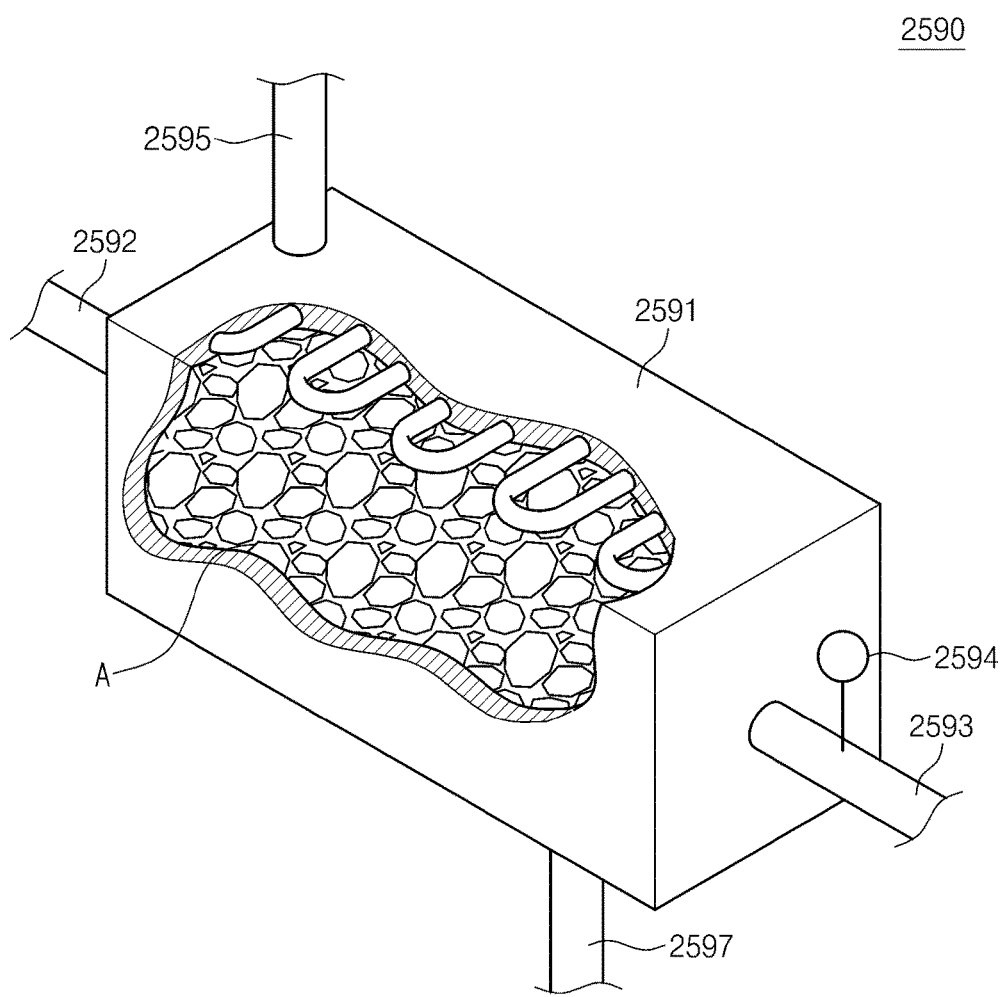
FIGS. 8 and 9 are views illustrating a modified example of the recycler of FIG. 7.

FIG. 7 is a cross-sectional view of the recycler 2570 of FIG. 4. FIG. 8 is a cross-sectional of the recycler 2570 of FIG. 4. Referring to FIG. 7, the recycler 2590 includes a column 2591, a supply tube 2592, a discharge tube 2593, a concentration sensor 2594, a gas supply tube 2595, a heater 2596, an exhaust tube 2597, and a controller 2598.

The column 2591 has a space in which an absorbent is provided therein. Referring to FIG. 8, the absorbent A is provided in the column 2591. The absorbent A has a plurality of pores to absorb the organic solvent in the pores. For example, zeolite may be used as the absorbent. The carbon dioxide is introduced into the column 2592 through the supply tube 2592. The supply tube 2592 connects the separator 2580 to the column 2591.

While the carbon dioxide passes through the column 2591, the absorbent A absorbs the organic solvent from the carbon dioxide. Thus, the organic solvent contained in the carbon dioxide may be removed to recycle the carbon dioxide. The recycled carbon dioxide is supplied into the supply unit 2560 through the discharge tube 2593.

The concentration sensor 2594 is disposed in the discharge tube 2593. The concentration sensor 2594 may detect a concentration of the organic solvent contained in the carbon dioxide that is discharged from the column 2591. Since an amount of organic solvent to be absorbed by the absorbent A is limited, when a concentration of the organic solvent contained in the carbon dioxide and measured by the concentration sensor 2594 is above a preset valve, the valve of the supply tube 2592 may be closed to determine a recycling moment. Thereafter, the gas supply tube 2595 may be opened to supply a purge gas into the column 2591.

Figure 9:
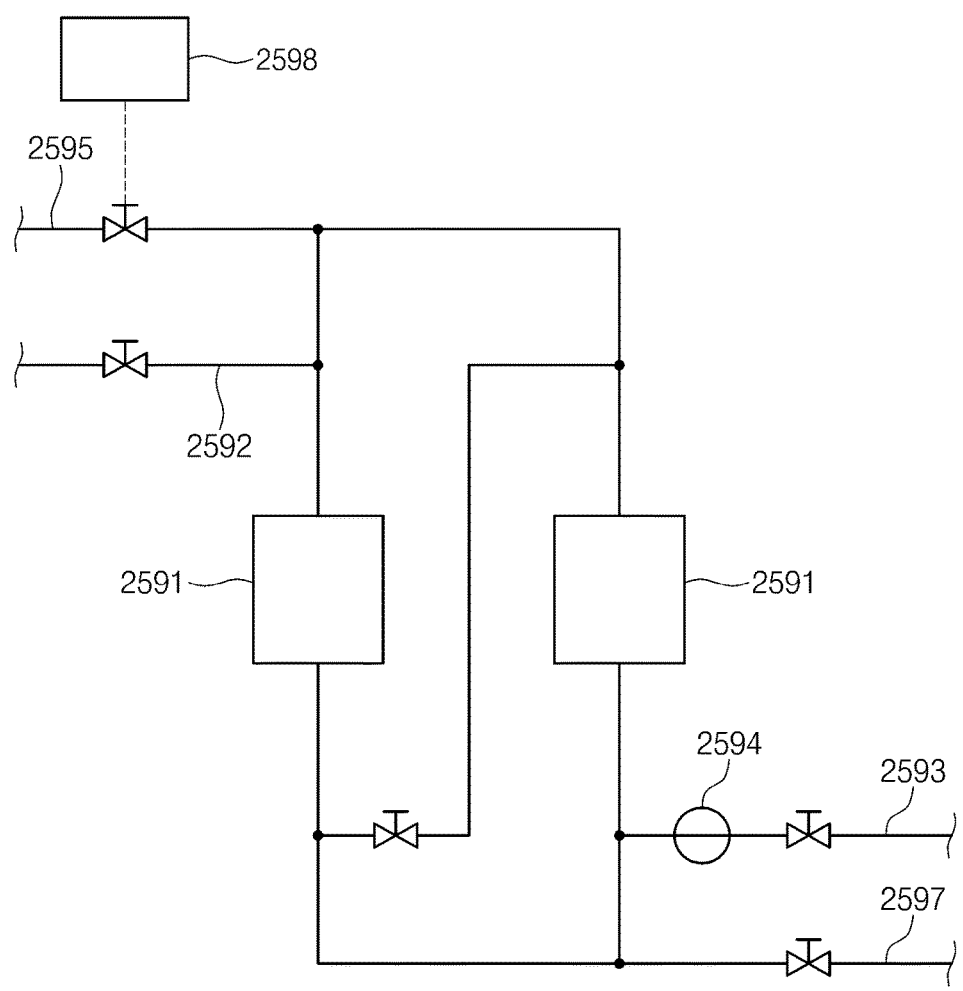
Figure 10:
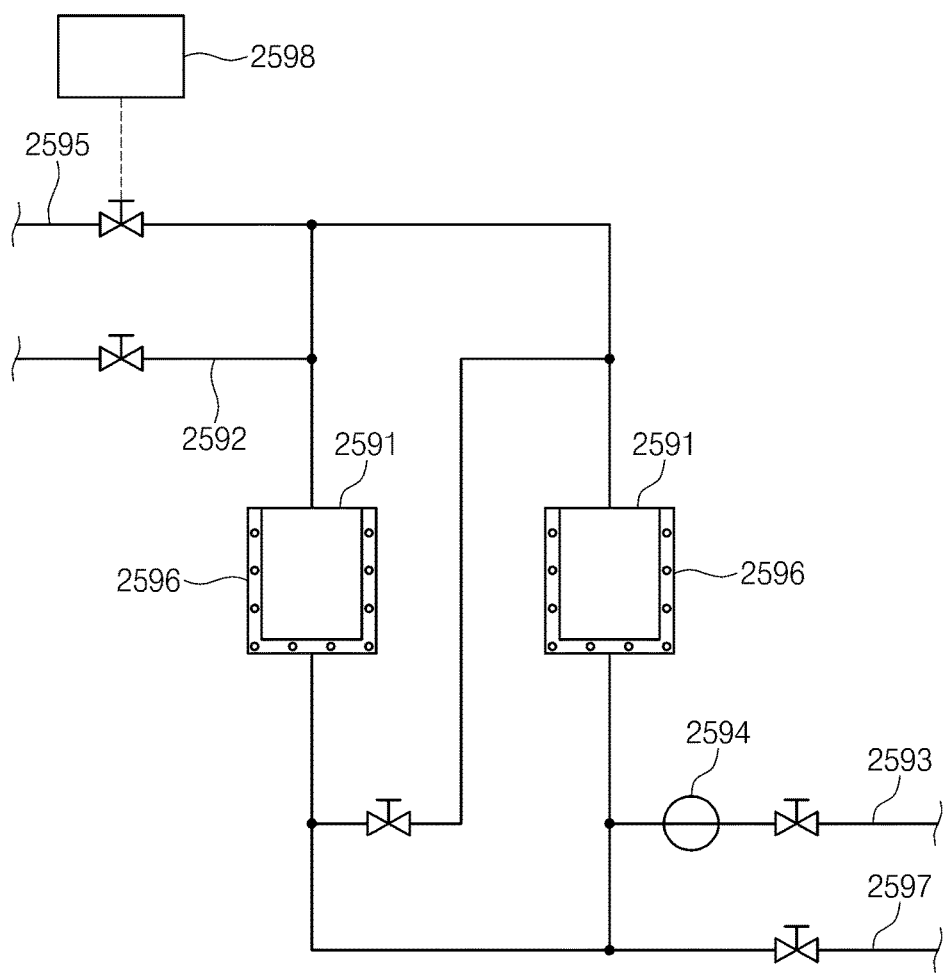
FIG. 10 is a cross-sectional view of the recycler of FIG. 7.

The gas supply tube 2595 supplies the purge gas into the column 2591. Referring again to FIG. 7, the gas supply tube 2595 may be branched from the supply tube 2592. The purge gas may separate the organic solvent absorbed to the absorbent A from the absorbent A. The heater 2596 heats the purge gas introduced into the column 2591 through the gas supply tube 2595. On the other hand, as shown in FIG. 9, the heater 2596 may be omitted. Also, as shown in FIG. 10, the heater 2596 may be disposed to surround the column 2591. A valve for adjusting a supply amount of purge gas is disposed in the gas supply tube 2596. The controller 2598 may control the valve to adjust the supply amount and time of purge gas. The exhaust tube 2597 exhausts the purge gas containing the organic solvent to the outside of the column 2591.

Figure 11:
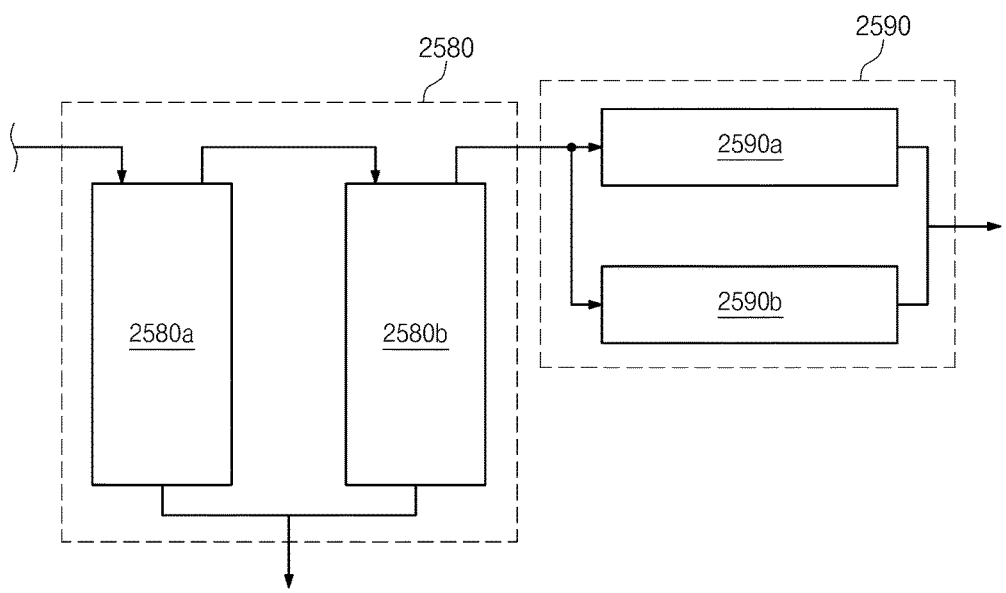
FIGS. 11 and 12 are views of a recycling unit according to another embodiment.

On the other hand, as shown in FIG. 11, the recycling unit 2570 may include a plurality of separators 2580. Here, the separators 2580 may be connected to each other in series. For example, a first separator 2580a primarily separates the carbon dioxide and the organic solvent from each other. Then, a second separator 2580b is connected to the first separator 2580a to secondarily separate the carbon dioxide and the organic solvent from each other. Thus, the separation of the organic solvent may be performed several times to obtain more pure carbon dioxide.

Also, as shown in FIG. 11, the recycler 2590 may be provided in plurality. Referring to FIG. 11, the recyclers 2590 may be connected to each other in parallel. As shown in FIG. 11, each of the first and second separators 2590a and 2590b may be connected to the separator 2580 to filter the organic solvent from the carbon dioxide, thereby supplying the filtered organic solvent into the supply unit 2560. When the plurality of recyclers 2590 are disposed in parallel, a large amount of carbon dioxide may be recycled for a short time.

Figure 12:
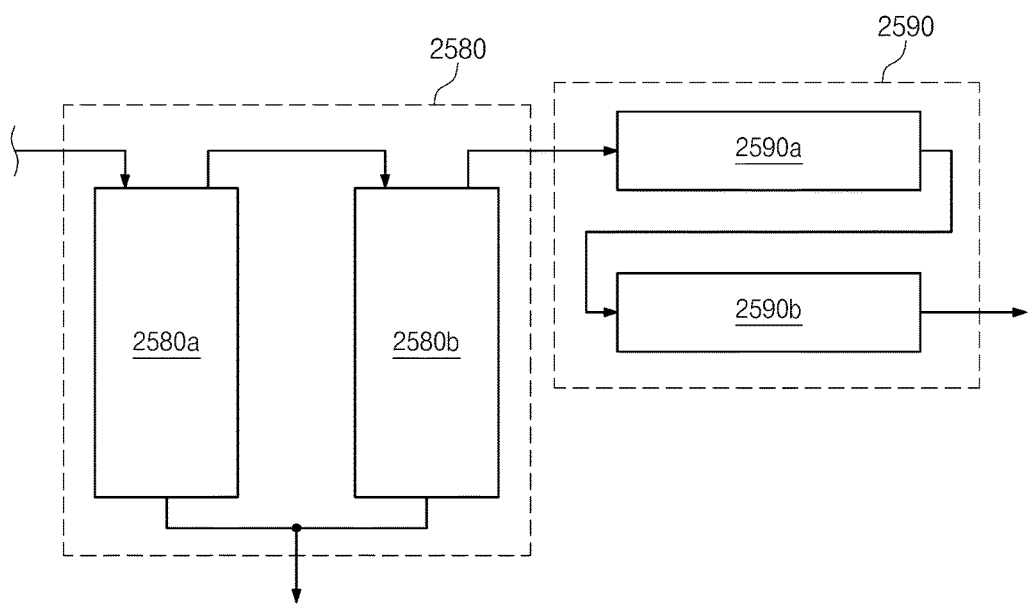

Referring to FIG. 12, the recyclers 2590 may be connected to each other in parallel. A first recycler 2590a is connected to the separator 2580 to primarily filter the organic solvent from the carbon dioxide. The second recycler 2590b is connected to the first recycler 2590a to secondarily filter the organic solvent from the carbon dioxide. The separation of the organic solvent from the carbon dioxide by the recycler may be performed several times.

Although the recycler 2590 is connected to the separator 2580 in the recycling unit 2570, the present invention is not limited thereto. For example, the separator 2580 may be omitted. When the separator 2580 is omitted in the recycling unit 2570, the recycler 2590 may be directly connected to the second process chamber 2500. On the other hand, the column 2591 of the recycler 2590 may be provided as a single column 2591. Also, the supply tube 2592 and the gas supply tube 2595, and the discharge tube 2593 and the exhaust tube 2597 may be connected to each other.

Hereinafter, a substrate treating method according to the present invention will be described with reference to the substrate treating apparatus 100.

However, this is merely for easy description, and thus, the substrate treating method according to the present invention is not limited to a method using the substrate treating apparatus 100. For example, the substrate treating method may be performed by using other devices that perform the same or similar function.

Figure 13:
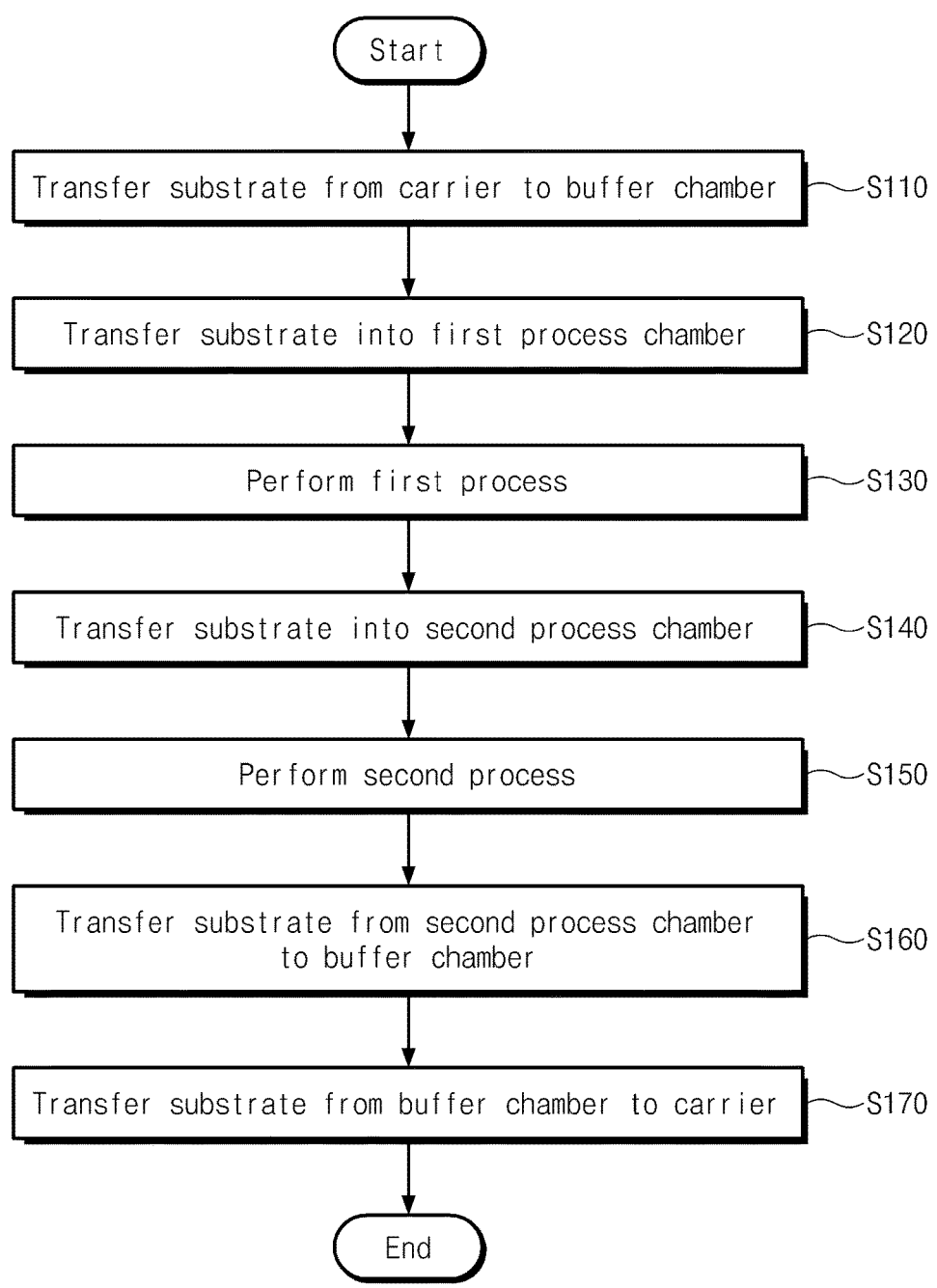
FIG. 13 is a flowchart of a cleaning process using a supercritical fluid.

FIG. 13 illustrates a cleaning process using a supercritical fluid.

The substrate treating method according to an embodiment includes a process (S110) of transferring a substrate S from a carrier C seated on a loadport 1100 to a buffer chamber 2100, a process (S120) of transferring the substrate S from the buffer chamber 2100 to a first process chamber 2300, a process (S130) of performing a first process, a process (S140) of transferring the substrate S from the first process chamber 2300 to a second process chamber 2500, a process (S150) of performing a second process, a process (S160) of transferring the substrate S from the second process chamber 2500 to the buffer chamber 2100, and a process (S170) of transferring the substrate S from the buffer chamber 2100 to the carrier C. Hereinafter, each of the above-described processes will be described.

In operation S110, an index robot 1210 transfers the substrate S from the carrier C to the buffer chamber 2100.

The carrier C in which the substrate S transferred from the outside is accommodated is placed on the loadport 1100. A carrier opener (not shown) or the index robot 1210 may open a door of the carrier C, and the index robot 1210 takes the substrate out of the carrier C. The index robot 1210 transfers the withdrawn substrate S into the buffer chamber 2100.

In operation S 120, a transfer robot 2210 transfers the substrate S from the buffer chamber 2100 to the first process chamber 2300.

When the substrate S is placed on a buffer slot of the buffer chamber 2100 by the index robot 1210, the transfer robot 2210 takes the substrate out of the buffer slot. The transfer robot 2210 transfers the substrate S into the first process chamber 2300.

Figure 14:
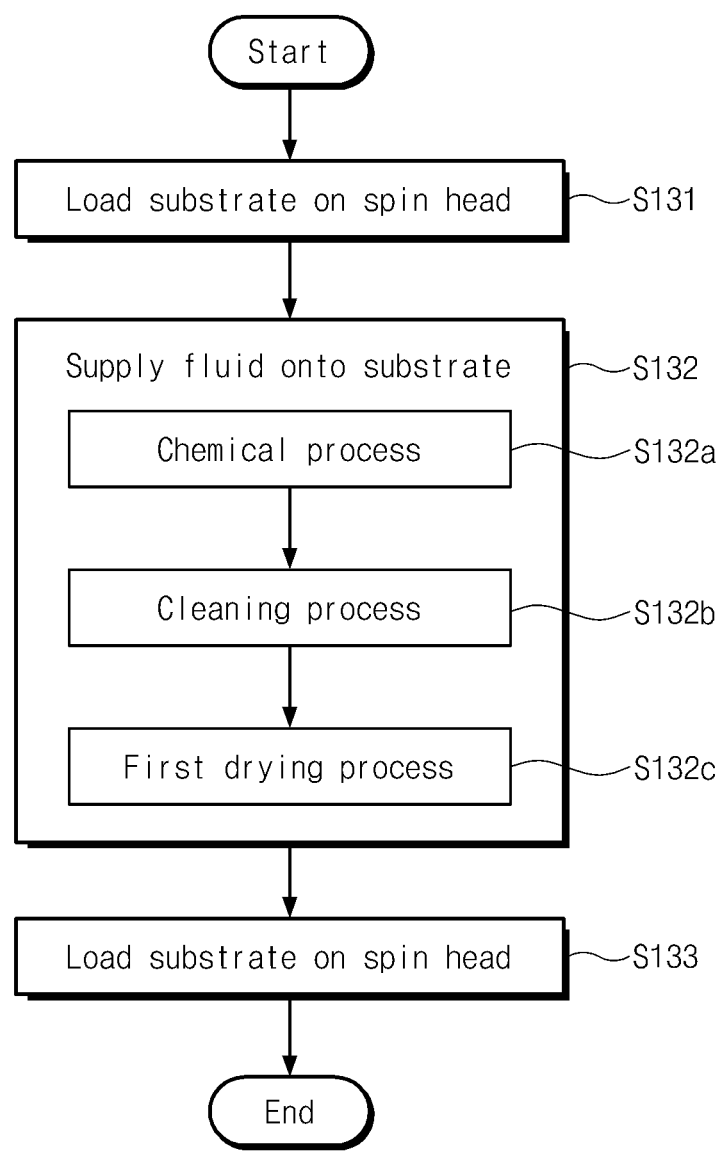
FIG. 14 is a flowchart of a first process.

In operation S130, the first process is performed in the first process chamber 2300. FIG. 14 is a flowchart of the first process.

In operation S131, the substrate S is placed on a support pin 2412 by the transfer robot 2210 and loaded on a spin head 2410. When the substrate S is placed on the support pin 2412, a chucking pin 2412 may move from a pick-up position to a fixing position to fix the substrate S. When the substrate is seated, a fluid supply member 2420 supplies a fluid onto the substrate S in operation S132. Here, while the fluid is supplied onto the substrate S, the spin head 2410 may be rotated to rotate the substrate S. Thus, the fluid may be adequately supplied onto an entire area of the substrate S. Also, after a recovery box 2430 vertically moves to the substrate S, the recovery box 2430 may recover the fluid bounced off the substrate S by the rotation of the substrate S.

Particularly, when the substrate S is seated, a first fluid supply member 2420a moves from a standby position to a support position to spray a first cleaning agent onto the substrate S in operation S132a (a first chemical process). Thus, particles, organic contaminants, metal impurities, and the like which are remain on the substrate S may be removed. Here, a first inflow hole 2431a of a first recovery box 2430a may move onto the same plane as the substrate S to recover the first cleaning agent.

Next, in operation S132b (a first cleaning process), the first fluid supply member 2420a moves to the standby position, and a second fluid supply member 2420b moves from the standby position to the support position to spray a rinsing agent. Thus, the residue of the first cleaning agent remaining on the substrate S may be cleaned. Here, a second inflow hole 2413b of a second recovery box 2430b may move onto the same plane as the substrate S to recover the rinsing agent.

Next, in operation S132c (a first drying process), the second fluid supply member 2420b returns to the standby position, and a third fluid supply member 2420c moves from the standby position to the support position to spray an organic solvent. Thus, the rinsing agent remaining on the substrate S is substituted with the organic solvent. Here, a second inflow hole 2413c of a third recovery box 2430c may move onto the same plane as the substrate S to recover the organic solvent. Also, the organic solvent may be provided in a state in which the organic solvent is heated at a temperature greater than room temperature so as to easily dry the organic solvent or be provided in a heated vapor state. Also, in the operation S132c, after the spraying of the organic solvent is finished, the spin head 2410 may rotate the substrate S so that the organic solvent is easily dried.

Also, a process (a second chemical process) of spraying the second cleaning agent through a fourth fluid supply member 2420*d* and a process (a second cleaning process) of spraying the rinsing agent through the second fluid supply member 2420*b* may be additionally performed between the operation S132*b* and the operation S132*c*. Here, the first and second cleaning agents may have components different from each other to effectively remove foreign substances different from each other.

Also, the operation S132*c* may be omitted in some case.

When the process of spraying the fluid onto the substrate S is finished, the rotation of the spin head 2410 is finished. Thus, the chucking pin 2413 may move from the fixing position to the pick-up position. In operation S133, the substrate S picks up by the transfer robot 2210 and thus is unloaded from the spin head 2410.

In operation S140, the transfer robot 2210 transfers the substrate S from the first process chamber 2300 to the second process chamber 2500.

The transfer robot 2210 picks up the substrate S seated on the spin head 2410 to take the substrate S out of the first process chamber 2300. The transfer robot 2210 transfers the substrate S into the second process chamber 2500. The substrate S transferred into the second process chamber 2500 is seated on the support member 2530.

Figure 15:
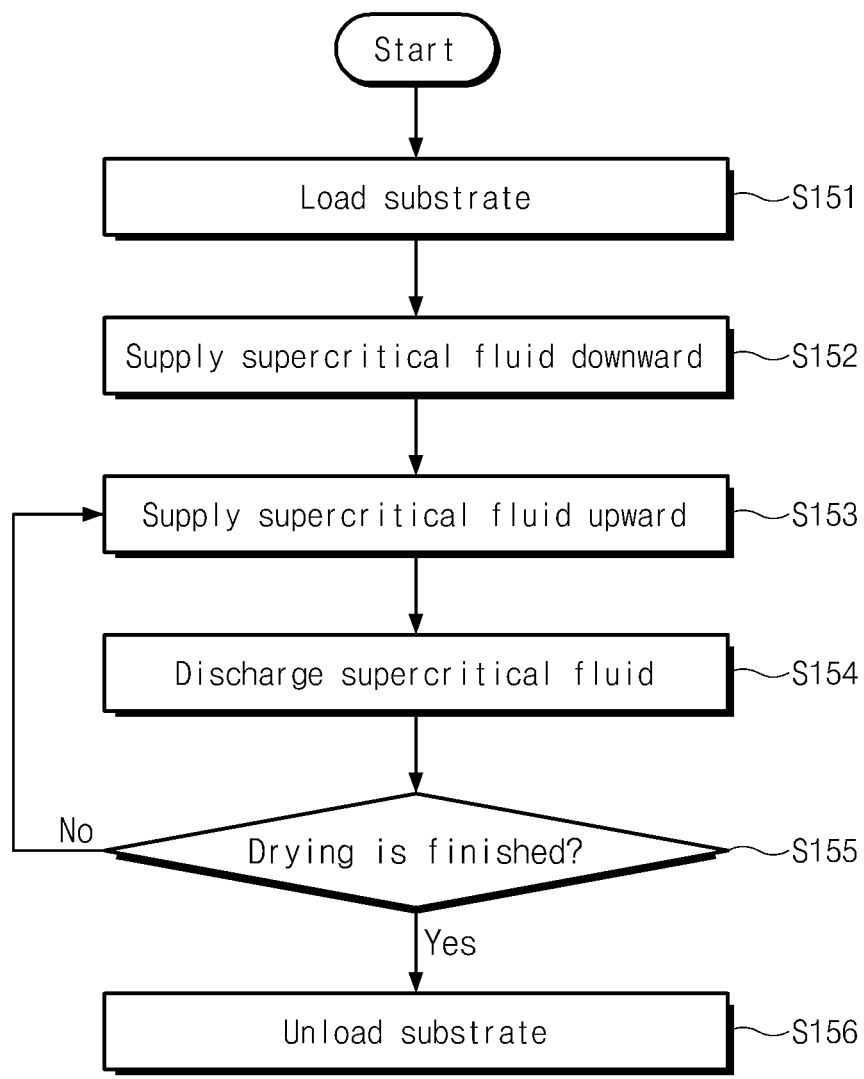
FIG. 15 is a flowchart of a second process.

In operation S150, the second process is performed in the second process chamber 2500. FIG. 15 is a flowchart of the second process.

In operation S151, the substrate S is loaded on the support member 2530 of the second process chamber 2500. In operation S152, after or before the substrate S is loaded, a supercritical fluid is supplied into the housing 2510 through a lower supply port 2544. When the supercritical fluid is continuously supplied to form a supercritical fluid atmosphere, the supercritical fluid is supplied into the housing 2510 through an upper supply port 2542. Thus, in operation S153, the substrate S may be quickly dried by the supercritical fluid. In this process, since the inside of the housing 2510 is in a critical state or more, even though the supercritical fluid is directly sprayed onto the substrate S at a high speed, the substrate S may be relatively less damaged or may not be damaged. When the substrate S is sufficiently dried, the supercritical fluid is discharged in operation S154. When the drying process is finished in operation S155, the substrate S is unloaded in operation S156.

Figure 16:
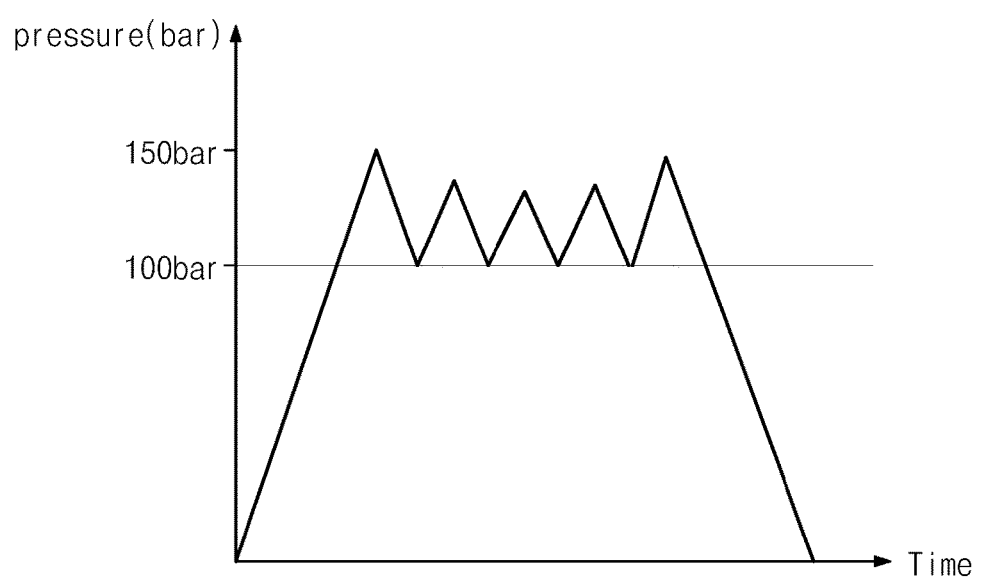
FIG. 16 is a view for explaining supply and exhaust of the supercritical fluid.

Selectively, the supply of the supercritical fluid may be repeatedly performed. FIG. 16 is a view for explaining supply and exhaust of the supercritical fluid. For example, in the operation S153, the supercritical fluid is supplied until an internal pressure of the housing 2510 reaches a pressure of about 150 bar by supplying the supercritical fluid. Then, the supercritical fluid is discharged until the internal pressure of the housing 2510 reaches a pressure of about 100 bar. Alternatively, according to the experiments, when compared that the substrate S is dried for a long time under the supercritical atmosphere, in case where the supercritical atmosphere and an inert atmosphere are alternately formed to dry the substrate S, it is seen that isopropyl alcohol remaining on the circuit pattern may be significantly removed. Thus, the above-described two processes may be alternately performed to significantly improve the drying efficiency.

Although the second drying process is performed by using an inert gas, the present invention is not limited thereto. For example, the second drying process may be performed b using only the supercritical fluid without using the inert gas. Particularly, liquid carbon dioxide may be continuously supplied for an initial second drying process, and the carbon dioxide may be continuously heated to change the liquid state into a gaseous state. Then, the carbon dioxide may be continuously supplied and thus pressed to form the supercritical atmosphere.

As described above, when the substrate S is dried by using the supercritical fluid, occurrences of particles, static electricity, collapse phenomenon, and the like, which may occur in the first drying process using the isopropyl alcohol or the spin dry process in which the substrate S rotates may be solved. Therefore, water mark may not remain on a surface of the substrate S to improve performance and yield of the semiconductor device.

Figure 17:
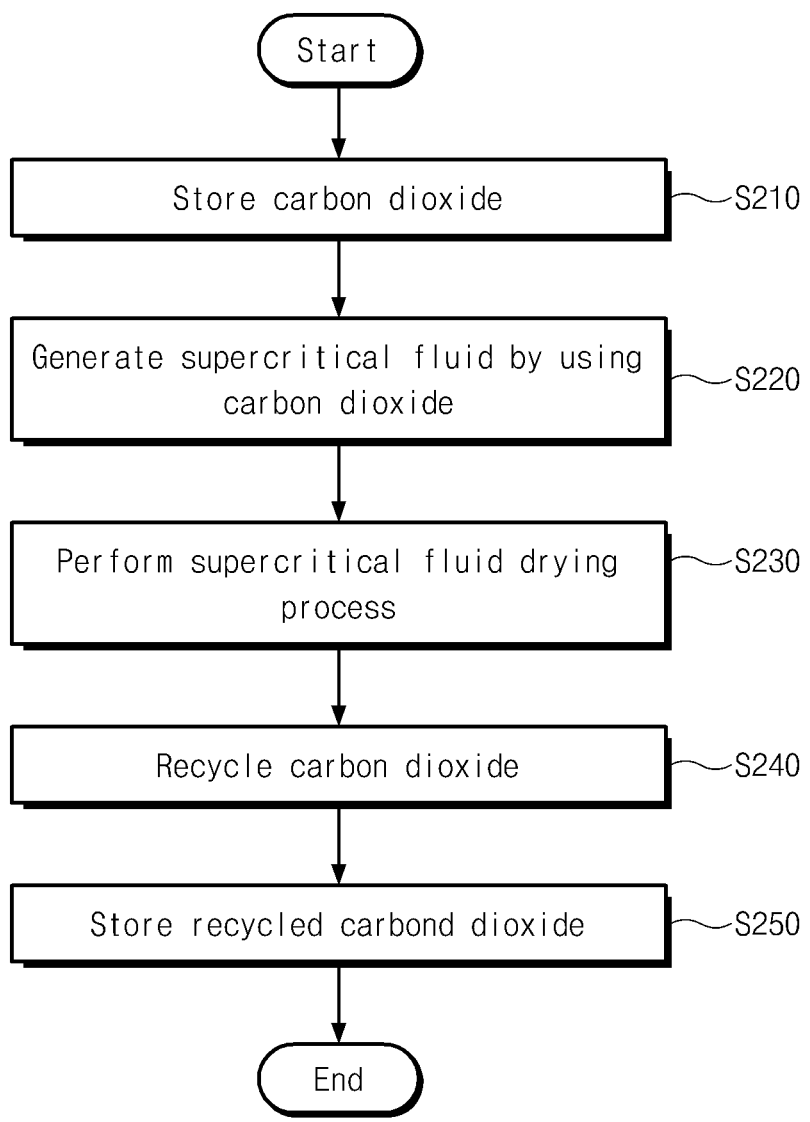
FIG. 17 is a flowchart illustrating a recycling method of the supercritical fluid.

FIG. 17 is a flowchart of a recycling process using the supercritical fluid.

A process of recycling the supercritical fluid includes a process (S210) of storing carbon dioxide, a process (S220) of changing the carbon dioxide into a supercritical fluid, a process (S230) of performing a driving process by using the supercritical fluid, a process (S240) of recycling the carbon dioxide, and a process (S250) of storing the recycled carbon dioxide. Hereinafter, each of the above-described processes will be described.

In operation S210, carbon dioxide is stored in a storage tank 2561. The carbon dioxide is supplied from an external carbon dioxide supply source F or the recycling unit 2570, and then is stored in liquid state. Here, the carbon dioxide may be supplied in a gaseous state. In this case, the gaseous carbon dioxide is changed into the liquid carbon dioxide by the first condenser 2563 to store the liquid carbon dioxide in a storage tank 2561.

In operation S220, a water supply tank 2562 generates the supercritical fluid by using the carbon diode. The water supply tank 2562 may receive the carbon dioxide from the storage tank 2561 to generate the supercritical fluid. Particularly, the carbon dioxide is discharged from the storage tank 2561 to move into the water supply tank 2562. Here, the carbon dioxide may be changed into the gaseous state by the pressure change. A second condenser 2564 and a pump 2564 are disposed on a line connecting the storage tank 2561 to the water supply tank 2562. The second condenser 2564 condenses the carbon dioxide having the gaseous state to change into the liquid carbon dioxide. The pump 2565 changes the liquid carbon dioxide into the carbon dioxide having a high-pressure gaseous state to the high-pressure carbon dioxide gas into the water supply tank 2562. The water supply tank 2562 heats the high-pressure carbon dioxide gas to generate the supercritical fluid. The water supply tank 2562 provides the supercritical fluid into the second process chamber 2500.

In operation S230, a drying process is performed by using the supercritical fluid in the second process chamber 2500. The second process chamber 2500 receives the supercritical fluid from the water supply tank 2562 to dry the substrate S by using the supercritical fluid. The above-described drying process may be the second drying process. The second process chamber 2500 discharges the supercritical fluid during the drying process or after the drying process is finished.

In operation S240, a recycling unit 2570 recycles the carbon dioxide. A primary separation may be performed in a separator 2580, and a secondary separation may be performed in the recycler 2590. The supercritical fluid discharged from the separator 2580 may be cooled to separate an organic solvent. The organic solvent is discharged through a drain tube 2585 disposed at a lower portion, and the carbon dioxide separated from the organic solvent is discharged through an exhaust tube 2584 disposed at an upper portion.

The secondary separation may be performed in the recycler 2590. The recycler 2590 may separate the organic solvent again from the carbon dioxide in which the organic solvent is primarily separated by the separator 2580.

Figure 18:
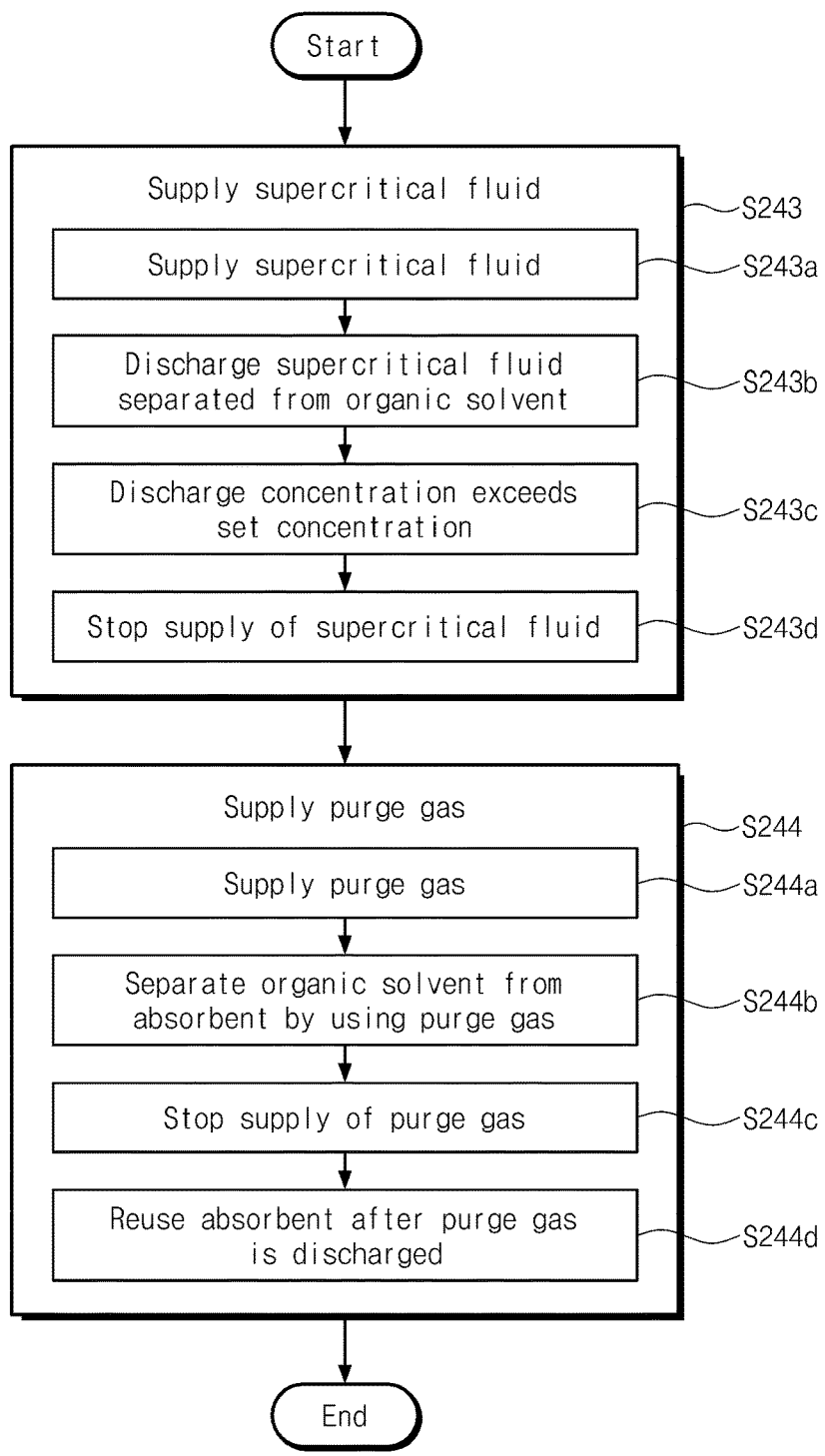
FIG. 18 is a flowchart of a recycling method in a recycler.

FIG. 18 is a flowchart of a method for recycling carbon dioxide in the recycler 2590.

First, in operation S243a, a supercritical fluid or carbon dioxide having a gaseous state is introduced into a column 2591 containing an absorbent A through a supply tube 2592. Here, the carbon dioxide passes through the adsorbent A. In this process, an organic solvent dissolved in the carbon dioxide is absorbed to the absorbent A. Thus, in operation S243b, the organic solvent is separated from the carbon dioxide, and high-concentration carbon dioxide is discharged through a discharge tube 2593. When reaches a set condition, the supply of the carbon dioxide is stopped. For example, the set condition may be a case in which a content of organic solvent to the discharged carbon dioxide, which is measured by a concentration sensor 2594 is above a preset value. In operation S243c, when the concentration of the carbon dioxide is above the preset value, the supply of the carbon dioxide is stopped in operation 243d.

Figure 19:
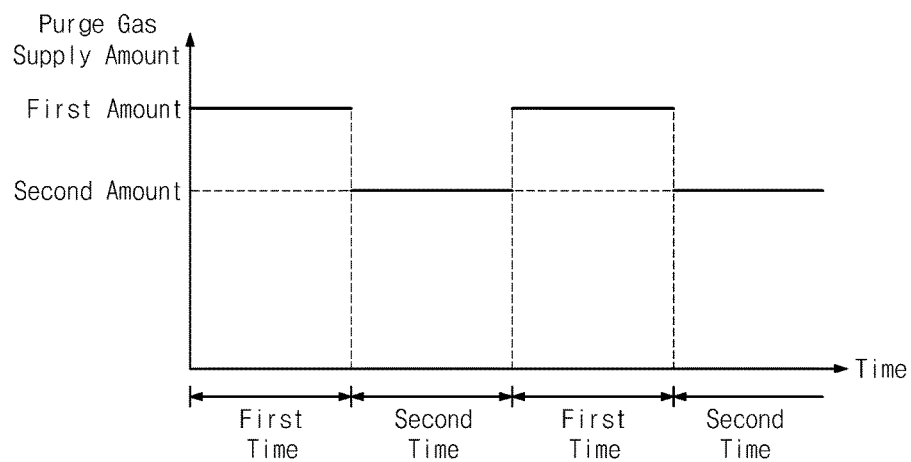
FIGS. 19 and 20 are views illustrating a state in which a controller controls supply of a purge gas.
Figure 20:
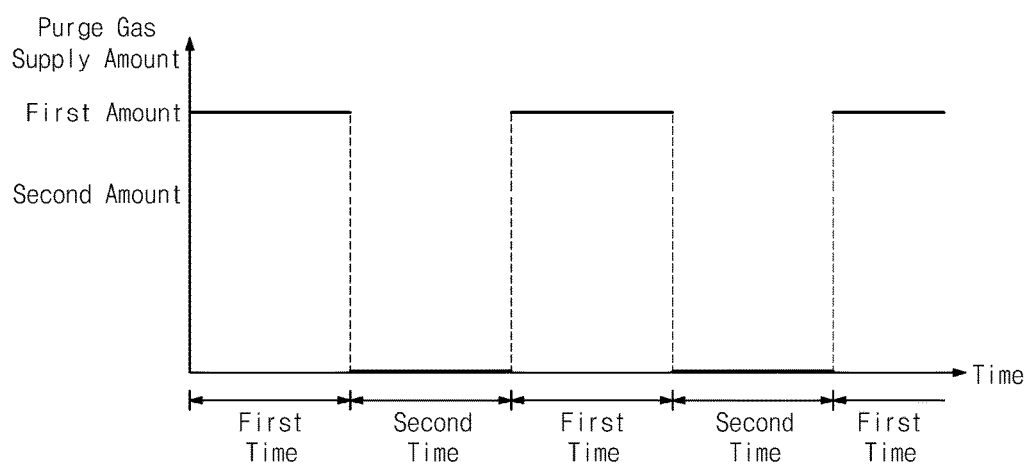

After the supply of the carbon dioxide is stopped, a purge gas is supplied into the column 2591 in operation S244a. For example, the purge gas may include a nitrogen gas ($N_2$). The nitrogen gas ($N_2$) may be supplied in a heated state into the column 2591. In operation S244b, the nitrogen gas ($N_2$) separates the organic solvent from the absorbent. A controller 2598 controls s valve so that the nitrogen gas ($N_2$) is non-uniformly supplied by lapse of time. For example, the nitrogen gas ($N_2$) may be supplied in a pulse-like manner. Referring to FIG. 19, the nitrogen gas ($N_2$) may be supplied by a first amount for one hour, and by a second amount for two hours. The first amount may be greater than the second amount. As shown in FIG. 19, the one hour and the two hours are continuously repeated. Also, on the other hand, as shown in FIG. 20, the second amount may be zero.

When the organic solvent is sufficiently separated from the absorbent, the supply of the nitrogen gas ($N_2$) is stopped in operation S244c. Thereafter, the nitrogen gas ($N_2$) is discharged to the exhaust tube 2597 in operation S244d. Since the organic solvent is separable from the absorbent by the nitrogen gas ($N_2$), the absorbent may be reused without being replaced. Thus, as a replacement period of the absorbent is extended, economic feasibility may be improved.

In operation S250, the recycling unit 2570 provides the recycled carbon dioxide to the storage tank 2561. When the recycling of the carbon dioxide is finished, the carbon dioxide move to the storage tank 2561 and then stored in the storage tank 2561. Here, since the carbon dioxide discharged from the recycling unit 2570 is in the gaseous state, the carbon dioxide gas is changed into the liquid carbon dioxide to move to the storage tank 2561.

In the substrate treating method according to the present invention, the processes in each of the embodiments are not necessary, and thus, the above-described processes in each of the embodiments may be selectively performed. Furthermore, the embodiments may be individually realized or combined with each other. Also, the processes according to each of the embodiments and the processes according to another embodiment may be individually realized or combined with each other.

Also, it is unnecessary to perform the processes according to each of the embodiments in foregoing order. For example, the process that is described later may be performed first than the process that is described first.

Also, the substrate treating method according to the present invention may be stored in a computer-readable recording medium in a code or program form.

According to the embodiment of the present invention, the absorbent used for recycling the supercritical fluid may be extended in life cycle.

The object of the present invention is not limited to the aforesaid, but other objects not described herein will be clearly understood by those skilled in the art from descriptions below.

The present invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims. Also, the embodiments set forth therein is not so limitedly, but all or part of the embodiments can be selectively combined so as to derive many variations.

What is claimed is:

1. A recycling unit comprising:
a column having a space in which an absorbent configured to absorb an organic solvent is stored;
a supply tube configured to supply a fluid discharged from a process chamber into the space of the column;
a discharge tube configured to discharge the fluid from which the organic solvent is separated in the column;
a concentration sensor in the discharge tube, the concentration sensor configured to measure a concentration of the organic solvent contained in the fluid discharged from the discharge tube;
a gas supply tube configured to supply a purge gas into the column so that the organic solvent is separated from the absorbent; and
an exhaust tube configured to exhaust the purge gas containing the organic solvent to the outside of the column,
wherein the organic solvent is separated from the fluid discharged from the process chamber to recycle the fluid,
the supply tube and the discharge tube face each other and the column is between the supply tube and the discharge tube,
the gas supply tube and the exhaust tube face each other and the column is between the gas supply tube and the exhaust tube,
the supply tube extending through a first wall of the column, the gas supply tube extending through a second wall of the column, and the first wall being substantially perpendicular to the second wall, and
the exhaust tube extending through a third wall of the column, the third wall substantially parallel to the second wall and substantially perpendicular to the first wall, the gas supply tube being at a first end of the column and the exhaust tube being at a second end of the column.

2. The recycling unit of claim 1, further comprising a heater configured to heat the purge gas supplied into the column.

3. The recycling unit of claim 1, further comprising:
a valve in the gas supply tube, the valve configured to adjust a supply amount of the purge gas; and a controller configured to control the valve so that the purge gas is non-uniformly supplied by lapse of time.

4. The recycling unit of claim 1, wherein the organic solvent comprises isopropyl alcohol (IPA), and the fluid comprises carbon dioxide ($CO_2$).

5. The recycling unit of claim 1, wherein the absorbent comprises zeolite.

6. A substrate treating apparatus comprising:
a process chamber in which an organic solvent remaining on a substrate is dissolved by using a fluid, that is provided as a supercritical fluid, to dry the substrate; and
a recycling unit comprising a recycler configured to separate the organic solvent from the fluid discharged from the process chamber to recycle the fluid, the recycler including,
a column having a space in which an absorbent configured to absorb the organic solvent is stored,
a supply tube configured to supply the fluid discharged from the process chamber into the space of the column,
a discharge tube configured to discharge the fluid from which the organic solvent is separated in the column,
a concentration sensor in the discharge tube, the concentration sensor configured to measure a concentration of the organic solvent contained in the fluid discharged from the discharge tube,
a gas supply tube configured to supply a purge gas into the column so that the organic solvent is separated from the absorbent, and
an exhaust tube configured to exhaust the purge gas containing the organic solvent to the outside of the column,
wherein the supply tube and the discharge tube face each other and the column is between the supply tube and the discharge tube,
the gas supply tube and the exhaust tube face each other and the column is between the gas supply tube and the exhaust tube,
the supply tube extending through a first wall of the column, the gas supply tube extending through a second wall of the column, and the first wall being substantially perpendicular to the second wall, and
the exhaust tube extending through a third wall of the column, the third wall substantially parallel to the second wall and substantially perpendicular to the first wall, the gas supply tube being at a first end of the column and the exhaust tube being at a second end of the column.

7. The substrate treating apparatus of claim 6, further comprising a heater configured to heat the purge gas supplied into the column.

8. The substrate treating apparatus of claim 6, further comprising:
a valve in the gas supply tube, the valve configured to adjust a supply amount of the purge gas; and
a controller configured to control the valve so that the purge gas is non-uniformly supplied by lapse of time.

9. The substrate treating apparatus of claim 8, wherein the controller is configured to supply the purge gas by a first amount for one hour and by a second amount for two hours,
wherein the first amount is greater than the second amount, and the one hour and the two hours are continuously repeated.

10. The substrate treating apparatus of claim 9, wherein the second amount is zero.

11. The substrate treating apparatus of claim 8, wherein the controller is configured to control the valve so that the purge gas is supplied in a pulse-like manner.

12. The substrate treating apparatus of claim 8,
wherein, when a measured concentration value reaches a preset value, the controller controls the purge gas so that the purge gas is supplied into the column to recycle the absorbent.

13. The substrate treating apparatus of claim 6, wherein the organic solvent comprises isopropyl alcohol (IPA), and the fluid comprises carbon dioxide ($CO_2$).

14. The substrate treating apparatus of claim 6, wherein the absorbent comprises zeolite.

15. The substrate treating apparatus of claim 6, wherein the recycling unit further comprises a separator between the process chamber and the recycler,
wherein the separator is configured to cool the fluid discharged from the process chamber to separate the organic solvent from the fluid, thereby supplying the fluid into the recycler.

16. The substrate treating apparatus of claim 6, wherein the column is provided in plurality, and
the plurality of columns are connected to each other in series.

* * * * *